United States Patent
Mikawa et al.

(10) Patent No.: US 9,713,282 B2
(45) Date of Patent: Jul. 18, 2017

(54) COOLING APPARATUS, IMAGE PROJECTION APPARATUS, AND ELECTRONIC DEVICE

(71) Applicants: Akihisa Mikawa, Kanagawa (JP); Tetsuya Fujioka, Kanagawa (JP); Hideo Kanai, Tokyo (JP); Masamichi Yamada, Kanagawa (JP); Yasunari Mikutsu, Tokyo (JP); Satoshi Tsuchiya, Kanagawa (JP); Yukimi Nishi, Tokyo (JP)

(72) Inventors: Akihisa Mikawa, Kanagawa (JP); Tetsuya Fujioka, Kanagawa (JP); Hideo Kanai, Tokyo (JP); Masamichi Yamada, Kanagawa (JP); Yasunari Mikutsu, Tokyo (JP); Satoshi Tsuchiya, Kanagawa (JP); Yukimi Nishi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/742,889

(22) Filed: Jun. 18, 2015

(65) Prior Publication Data

US 2015/0373873 A1 Dec. 24, 2015

(30) Foreign Application Priority Data

Jun. 23, 2014 (JP) .................................. 2014-128006

(51) Int. Cl.
*G03B 21/16* (2006.01)
*H05K 7/20* (2006.01)
*H01L 23/467* (2006.01)

(52) U.S. Cl.
CPC ......... *H05K 7/20154* (2013.01); *G03B 21/16* (2013.01); *H01L 23/467* (2013.01); *H01L 2924/0002* (2013.01)

(58) Field of Classification Search
CPC ........ G03B 21/14; G03B 21/16; G03B 21/18; G03B 21/145; G03B 21/2033; G03B 21/204; H04N 9/3144; H01L 23/467
See application file for complete search history.

(56) References Cited

U.S. PATENT DOCUMENTS 5,381,859 A 1/1995 Minakami et al.
5,862,038 A * 1/1999 Suzuki ................ H01L 23/4006
165/80.2

(Continued)

FOREIGN PATENT DOCUMENTS

EP 2574159 3/2013
JP 4144037 9/2008

(Continued)

OTHER PUBLICATIONS

Extended European Search Report dated Dec. 11, 2015.

*Primary Examiner* — Sultan Chowdhury
(74) *Attorney, Agent, or Firm* — IPUSA, PLLC

(57) ABSTRACT

A cooling apparatus including an air blow part including an air outtake port; and a heat dissipater including a plurality of heat dissipating fins, wherein an end side of an upper surface of the heat dissipater is linearly aligned, wherein the plurality of heat dissipating fins includes a first heat dissipating area and a second heat dissipating area, wherein a surface area of the heat dissipating fins arranged in the first heat dissipating area is smaller than a surface area of the heat dissipating fins arranged in the second heat dissipating area, wherein the heat dissipating fins are arranged at a position facing the air outtake port of the air blow part.

9 Claims, 19 Drawing Sheets

(56) References Cited

U.S. PATENT DOCUMENTS

| | | | |
|---|---|---|---|
| 6,199,624 B1 * | 3/2001 | Wotring | H01L 23/3672 |
| | | | 165/121 |
| 6,231,191 B1 * | 5/2001 | Shiraishi | G03B 21/16 |
| | | | 353/119 |
| 9,004,696 B1 | 4/2015 | Mikawa et al. | |
| 2005/0067152 A1 | 3/2005 | Huang et al. | |
| 2005/0201107 A1 * | 9/2005 | Seki | G03B 21/16 |
| | | | 362/373 |
| 2011/0032489 A1 * | 2/2011 | Kimoto | G03B 21/16 |
| | | | 353/56 |
| 2011/0214904 A1 | 9/2011 | Ohsawa et al. | |
| 2012/0327316 A1 | 12/2012 | Okada et al. | |
| 2013/0048256 A1 | 2/2013 | Wang et al. | |
| 2013/0258666 A1 * | 10/2013 | Sato | G03B 21/16 |
| | | | 362/249.01 |
| 2014/0000851 A1 * | 1/2014 | Wang | F28D 15/02 |
| | | | 165/104.26 |

FOREIGN PATENT DOCUMENTS

| | | |
|---|---|---|
| JP | 2014-106288 | 6/2014 |
| JP | 2014-167502 | 9/2014 |
| JP | 2015-005714 | 1/2015 |
| JP | 2015-005715 | 1/2015 |
| JP | 2015-072354 | 4/2015 |

\* cited by examiner

COOLING APPARATUS, IMAGE PROJECTION APPARATUS, AND ELECTRONIC DEVICE

BACKGROUND OF THE INVENTION

1. Field of the Invention

The present invention relates to a cooling apparatus, an image projection apparatus, and an electronic device.

2. Description of the Related Art

An example of a cooling apparatus for cooling a heat source has a structure where a heat dissipator having multiple heat dissipating fins presses against the heat source so as to expand a heat dissipation area and an air taken out by a fan is directly blown to the heat dissipating fin for the cooling.

An example of the cooling apparatus is formed such that each heat dissipator having heat dissipating fins is provided inside each of air outtake ports of a fan having multiple air outtake ports, a pitch of the heat dissipating fins of the heat dissipator provided inside one of the air outtake ports is made uniformly smaller than a pitch of the heat dissipating fins of the heat dissipator provided inside the other one of the air outtake ports is disclosed in, for example, Patent Document 1.

The cooling apparatus of Patent Document 1 is formed so that the heat dissipator is provided inside the air outtake port. Therefore, the cooling apparatus is optimally designed in consideration of a positional relationship between the heat dissipator and vanes of the fan and types of fans combined and a layout of the fans are limited. In a case where the heat dissipator is to be replaced by another heat dissipator corresponding to the heat source, there is a problem that a peripheral part is subjected to a design change.

Patent Document 1: Japanese Patent No. 4144037

SUMMARY OF THE INVENTION

Accordingly, embodiments of the present invention provide a novel and useful cooling apparatus, an image projection apparatus, and an electronic device solving one or more of the problems discussed above. More specifically, the embodiments of the present invention may provide a cooling apparatus which does not require the design change of the peripheral part at a time of replacing the heat dissipator.

One aspect of the embodiments of the present invention may be to provide a cooling apparatus including an air blow part including an air outtake port; and a heat dissipater including a plurality of heat dissipating fins, wherein an end side of an upper surface of the heat dissipater is linearly aligned, wherein the plurality of heat dissipating fins includes a first heat dissipating area and a second heat dissipating area, wherein a surface area of the heat dissipating fins arranged in the first heat dissipating area is smaller than a surface area of the heat dissipating fins arranged in the second heat dissipating area, wherein the heat dissipating fins are arranged at a position facing the air outtake port of the air blow part.

Additional objects and advantages of the embodiments will be set forth in part in the description which follows, and in part will be clear from the description, or may be learned by practice of the invention. Objects and advantages of the invention will be realized and attained by means of the elements and combinations particularly pointed out in the appended claims.

DETAILED DESCRIPTION OF THE PREFERRED EMBODIMENTS

A description is given below, with reference to the FIG. 1 through FIG. 27 of embodiments of the present invention. Where the same reference symbols are attached to the same parts, repeated description of the parts is omitted.

Reference symbols typically designate as follows:
1: image projection apparatus;
2: screen;
3: exterior cover;
20: light source device;
21: light source;
22: light source bracket;
23: outgoing window;
24: holder;
25: duct;
30: optical engine unit;
31: illumination optical unit;
32: image processing unit;
33: projection optical unit;
34: concave mirror;
35: cylindrical mirror;
36: relay lens;
37: light tunnel;
38: color wheel;
41: element;
42: DMD printed circuit board;
43: heatsink;
44: fixed plate;
45: fin;
45a: first heat dissipating area;
45b: second heat dissipating area;
451: fin of first heat dissipating area;
452: fin of second heat dissipating area;
4510: end fin;
51: projection lens;
53: OFF light plate;
54: return mirror;
55: free curved surface mirror;
60: sirocco fan;
71: first air intake port;
72: second air intake port;
73: air outtake port;
73a: first air outtake area;
73b: second air outtake area; and
80: duct.

Described next is an embodiment of a cooling apparatus, an image projection apparatus, and an electronic device. In the figures, the same reference symbols attached to the same portions or portions similar thereto, and description of these portions are appropriately simplified or omitted. Further, relative ratios among the members and parts are not considered in the figures. Therefore, specific dimensions can be determined by a person ordinarily skilled in art in light of the non-limiting embodiments described below.

Hereinafter, the cooling apparatus of the embodiment of the present invention is preferably installed in the image projection apparatus. Therefore, after illustrating an entire structure of the image projection apparatus, structures of the cooling apparatus and a cooling structure are specifically described.

<Image Projection Apparatus>

Figure 1:
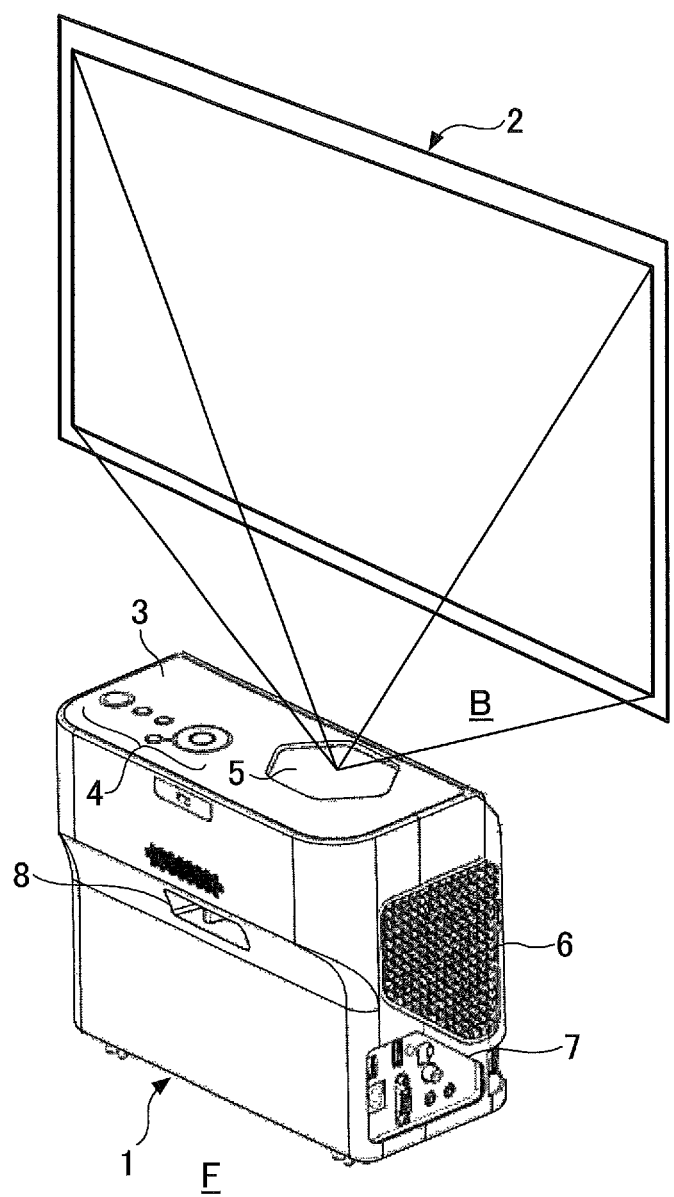
FIG. 1 is a perspective view illustrating a mode of using an image projection apparatus of an embodiment of the present invention.
Figures 2A, 2B:
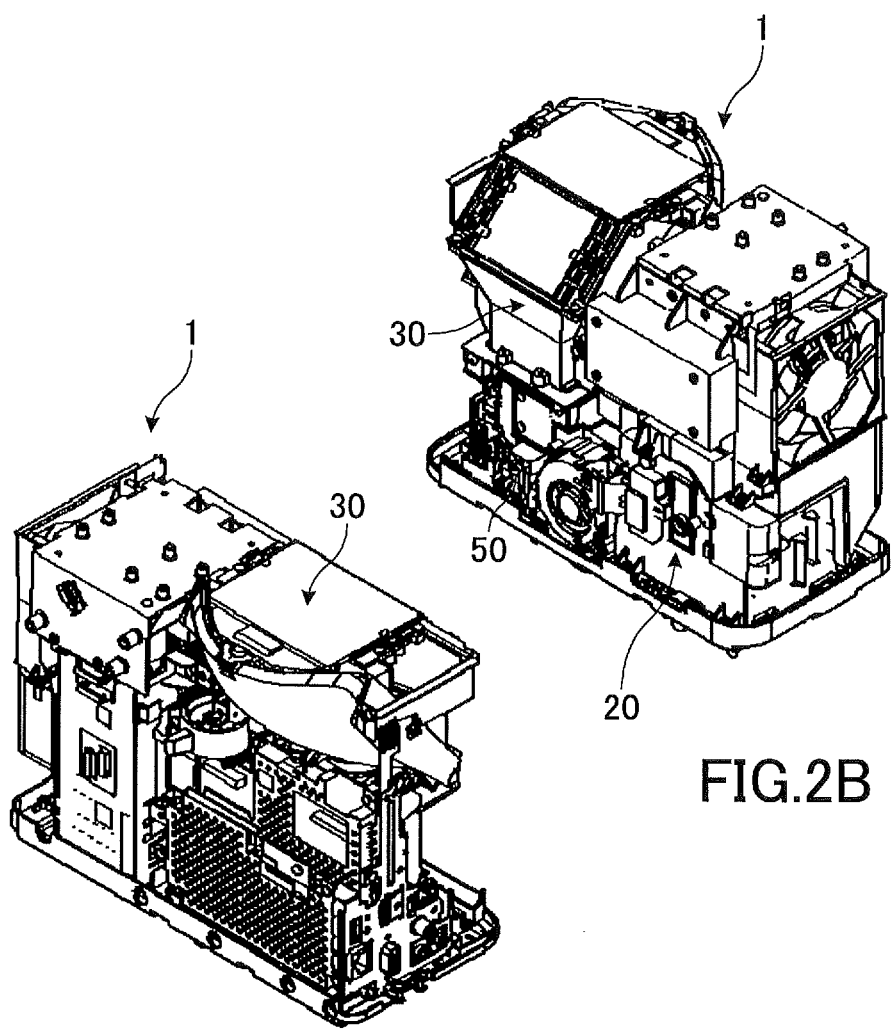
FIG. 2A is a perspective view illustrating an inner structure of the image projection apparatus viewed on a front side of FIG. 1.
FIG. 2B is a perspective view illustrating the inner structure of the image projection apparatus viewed on a back side of FIG. 1.

FIGS. 1-2 illustrate an example of a schematic structure of the image projection apparatus 1 of the embodiment of the present invention. FIG. 1 is a perspective view of a schematic structure of the image projection apparatus 1 when an image is projected. FIGS. 2A and 2B illustrate an internal structure of the image projection apparatus without its exterior cover 3. FIG. 2A is a perspective view viewed from a front side F of FIG. 1. FIG. 2B is a perspective view viewed from a back side B of FIG. 1.

The image projection apparatus 1 produces a video based on video data input from a personal computer, a video camera, or the like, and projects the video onto a screen, which is a projection plane, so as to display the video. The image projection apparatus 1 is a liquid crystal projector of a front type, which is compact and light weighted, using a digital micro-mirror device (DMD). Further, although the image projection apparatus 1 is a tower type, the embodiment is not limited to the tower type.

An inner structure of the image projection apparatus 1 is installed inside the exterior cover 3. An operation unit 4 and a light projection port 5 are provided on an upper surface, an air intake port 6 and a connector unit 7 are provided on a right side surface, an air outtake port is provided on a left side surface (not illustrated), and a focus adjusting unit 8 is provided on a front surface 8.

Further, as illustrated in FIG. 2, the image projection apparatus 1 roughly includes a light source device 20, an optical engine 30, and a cooling apparatus 50, as a basic structure. Further, structures ordinarily installed in a liquid crystal projector are similarly installed, and a detailed description of the structures are omitted.

Figure 3:
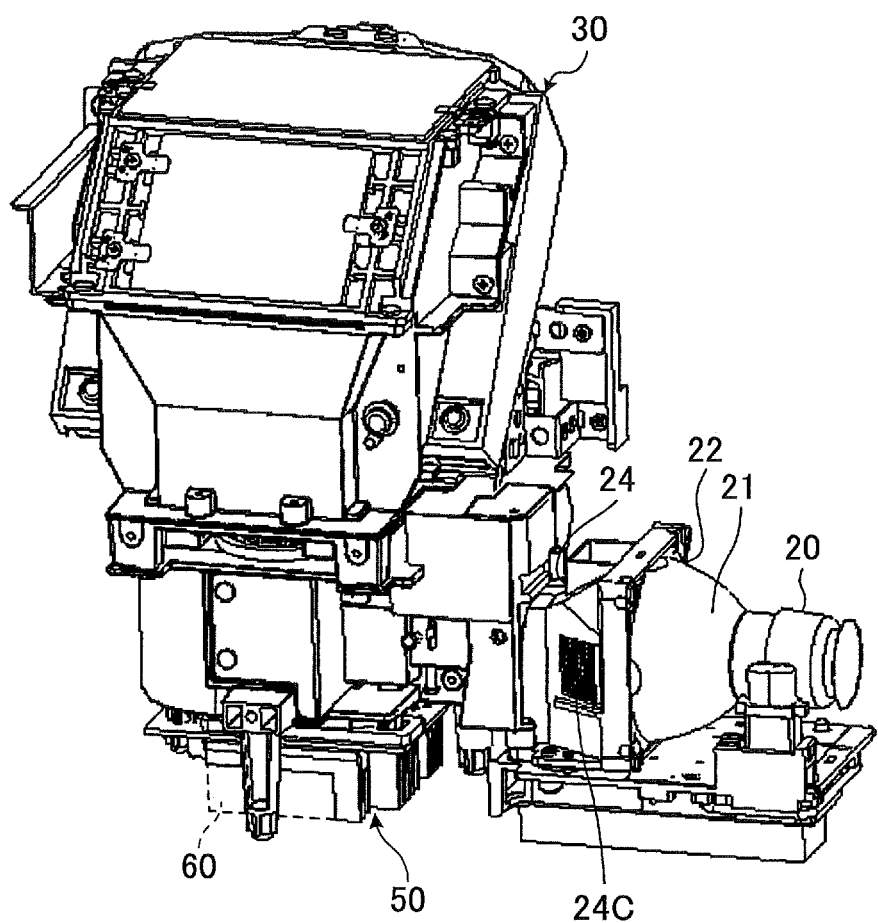
FIG. 3 is a perspective view illustrating a relationship between an optical engine and a light source device.
Figure 4:
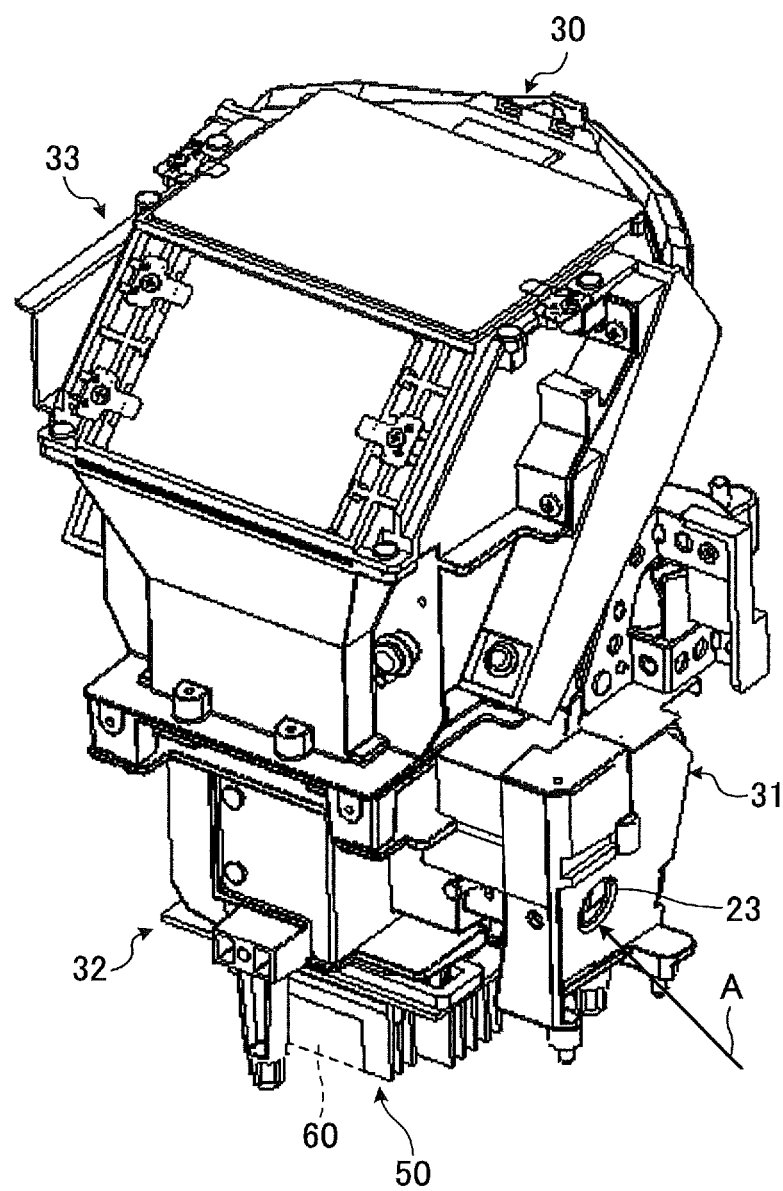
FIG. 4 is a perspective view schematically illustrating the structure of the optical engine.

Referring to the figures, described next is a light source device 20, an optical engine 30, and a cooling apparatus 50. FIG. 3 illustrates a state where the light source device 20, the optical engine 30, and the cooling apparatus 50 are taken out of the image projection apparatus 1. FIG. 4 illustrates a state where only the optical engine 30 and the cooling apparatus 50 are taken out of the image projection apparatus 1.

The cooling apparatus 50 is described in detail and is formed by combining with a sirocco fan (an air blow part) 60 indicated by a broken line. The light source device 20 controls a light source such as a high-pressure mercury lamp to supply an incandescent light necessary for an image projection to the optical engine unit 30.

The light source device 20 includes a light source bracket 22 which is a holding member for holding a light source 21. The light source 21 such as a halogen lamp, a metal halide lamp, or a high-pressure mercury lamp is attached to the light source bracket 22.

A holder 24 holding a reflector (not illustrated) is secured by a screw to the light source bracket 22 on a light outgoing side of the light source 21. An outgoing window 23 (see FIG. 4) is provided on a surface of the holder 24 opposite to a side where the light source is arranged. The light outgoing from the light source 21 converges into the outgoing window 23 by the reflector (not illustrated) held by the holder 24 and outgoes from the outgoing window 23.

A light source air supply port (omitted from illustration), through which an air for cooling the light source 21 flows, and a light source air outtake port 24C, through which an air heated by heat of the light source 21 is exhausted, are provided on a side surface of the holder 24.

The optical engine unit 30 performs a control of processing and projecting the input image data using the light supplied from the light source device 20. FIG. 4 is a perspective view illustrating a detailed structure of the optical engine unit 30. The optical engine unit 30 includes an illumination optical unit 31, a projection optical unit 33, and an image processing unit 32. The incandescent light from the above light source device 20 firstly irradiates the illumination optical unit 31. The illumination optical unit 31 disperses the incandescent light from the light source device 20 to components of RGB and guides the dispersed lights to the image processing unit 32. The image processing unit 32 forms an image in response to a modulation signal, and generates an image to be projected from the input image data. The projection optical unit 33 performs an extended projection of the image generated by the image processing unit 32 onto an illuminated surface.

Figure 5:
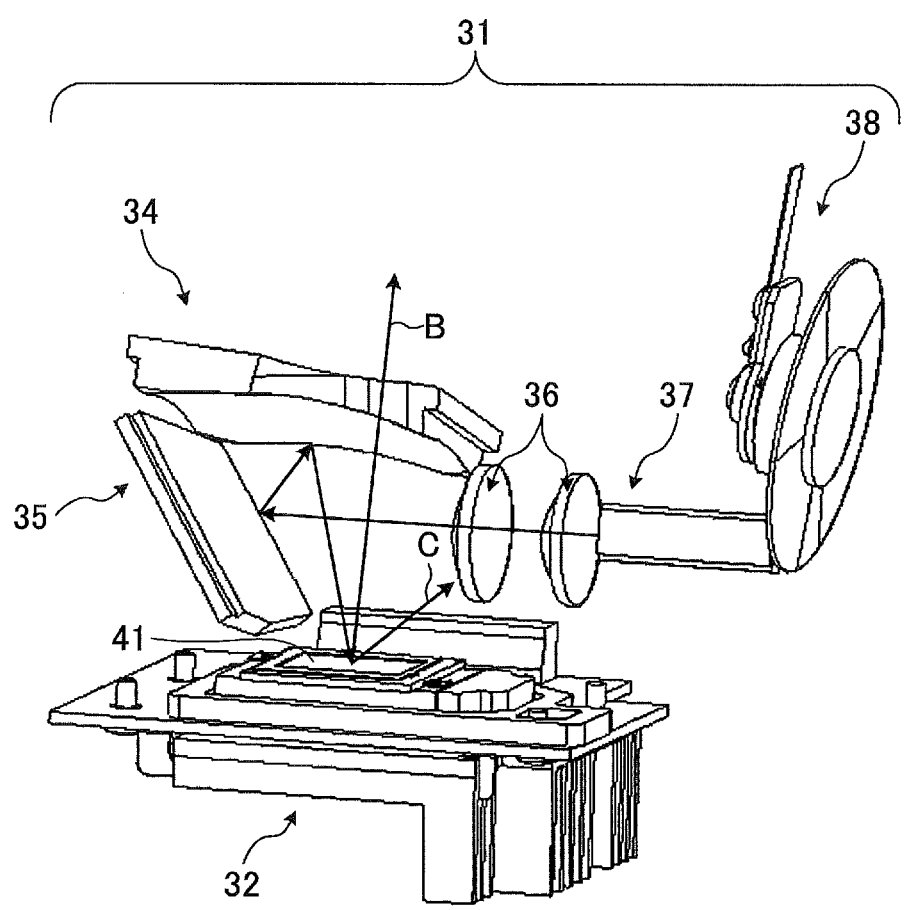
FIG. 5 illustrates an schematic structure of the illumination optical unit, an image processing unit, and a light path.

FIG. 5 illustrates arrangements of the illumination optical unit 31 and the image processing unit 32 and a light path.

The illumination optical unit 31 includes a color wheel 38, a light tunnel 37, a relay lens 36, a cylindrical mirror 35, and a concave mirror 34. The color wheel 38 converts the incandescent light outgoing from the light source device 20 to lights of RGB by a color filter in a disk-like shape and outgoes as the lights of RGB repeated each unit time.

The light tunnel is formed to be like a cylinder by cementing sheet glasses. The light tunnel guides the light outgoing from the color wheel 38. The relay lens 36 is formed of a combination of two lenses and converges the light from the light tunnel while correcting a chromatic aberration of the light.

The cylindrical mirror 35 and the concave mirror 34 reflects the light outgoing from the relay lens 36. The reflected light enters into the image processing unit 32. The image processing unit 32 includes a DMD element 41, which has a mirror face made of multiple micro mirrors and is substantially in a rectangular shape. In the DMD element 41, the multiple micro mirrors are subjected to a time-sharing drive based on data of a video or an image to process and reflect a projection light and form a predetermined video. In the image processing unit 32, the light used by the multiple micro mirrors based on the video data subjected to the time sharing by the DMD element 41 (a first cooling target) is reflected in a direction of the projection lens 51 indicated by an arrow B in FIG. 5. A light indicated by an arrow C is reflected toward an OFF light plate 53 so as to be discarded.

Figure 6:
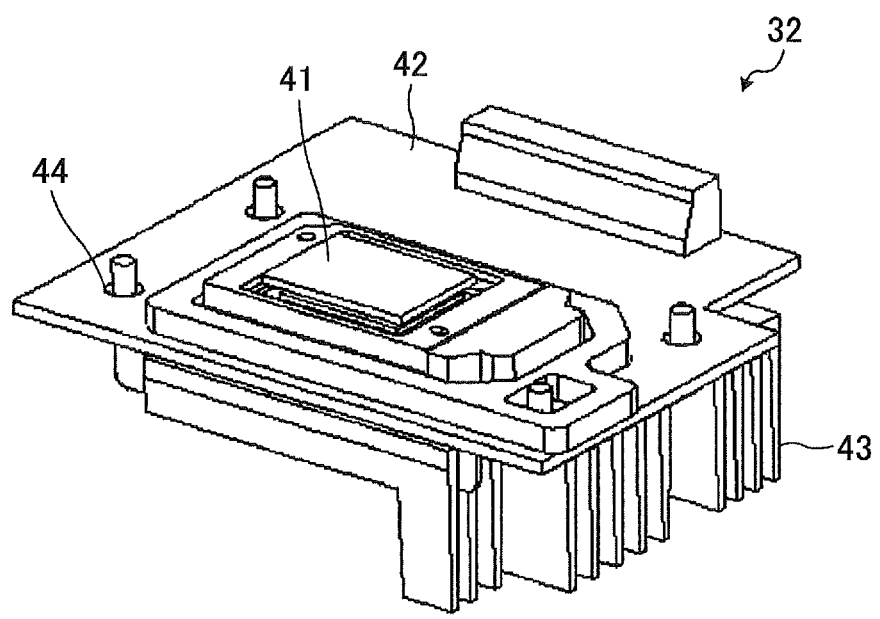
FIG. 6 is a perspective view illustrating the schematic structure of the image processing unit.

FIG. 6 is a perspective view illustrating the structure of the image processing unit 32. The image processing unit 32 includes a DMD element 41, a DMD printed circuit board 42 for controlling the DMD element 41, a heatsink 43 for cooling the DMD element 41, and a fixed plate 44 for pressing the heatsink 43 onto the DMD element 41. Within this embodiment, the heatsink 43 corresponds to a heat dissipator. The heatsink 43 dissipates heat of the DMD element 41 by contacting the DMD element 41, which is the first cooling target.

Figure 7:
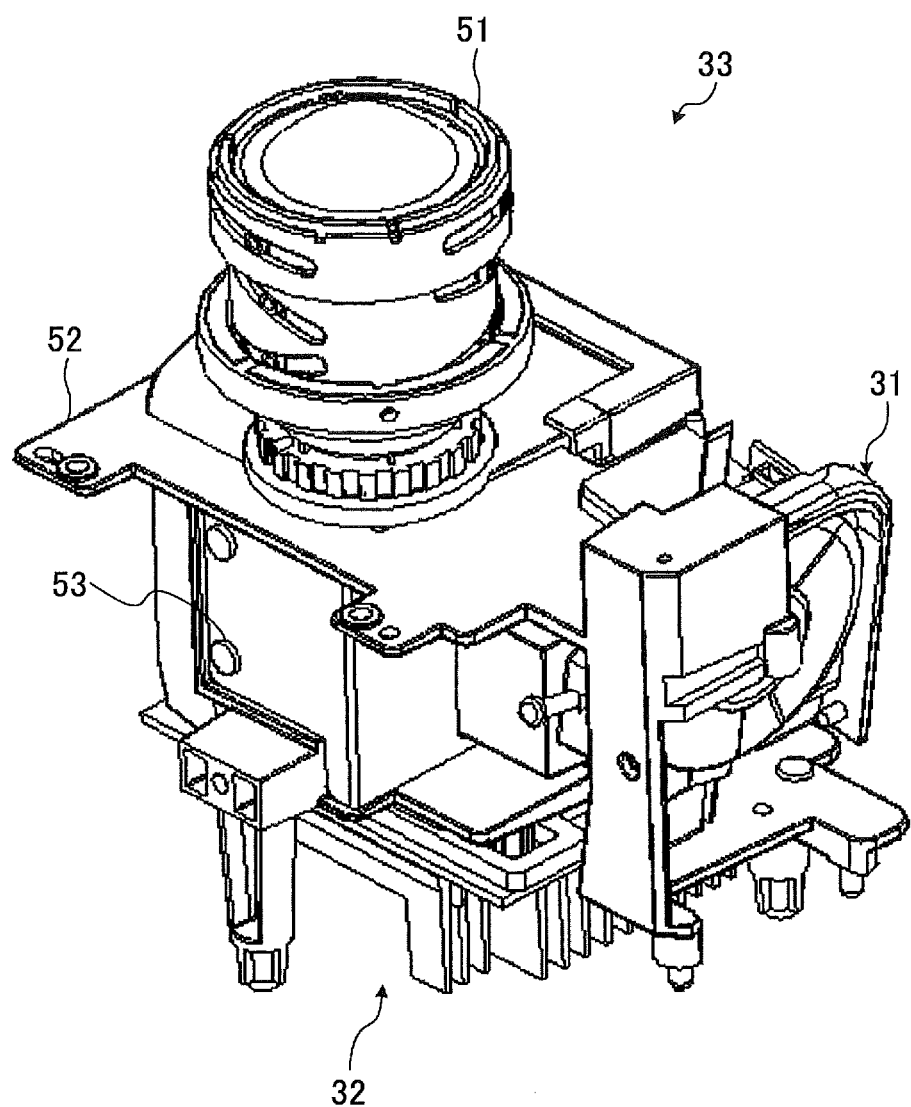
FIG. 7 is a perspective view illustrating a part of a structure of a projection optical unit.
Figure 8:
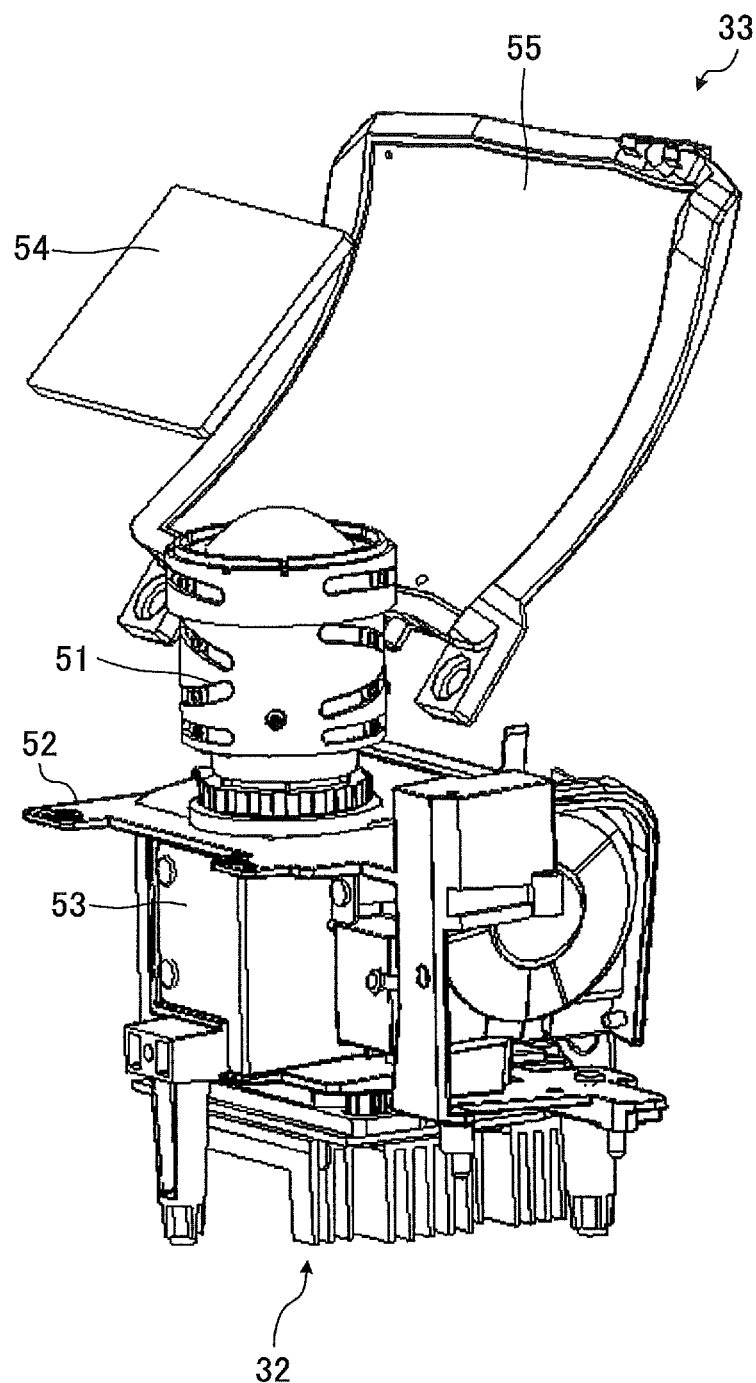
FIG. 8 is a perspective view illustrating the structure of the projection optical unit.

FIGS. 7 and 8 are perspective views illustrating the structure of the projection optical unit 33. The light passing through the image processing unit 32 is reflected toward the projection lens 51 illustrated in FIG. 7. The discarded light is reflected toward the OFF light plate 53.

Figure 9:
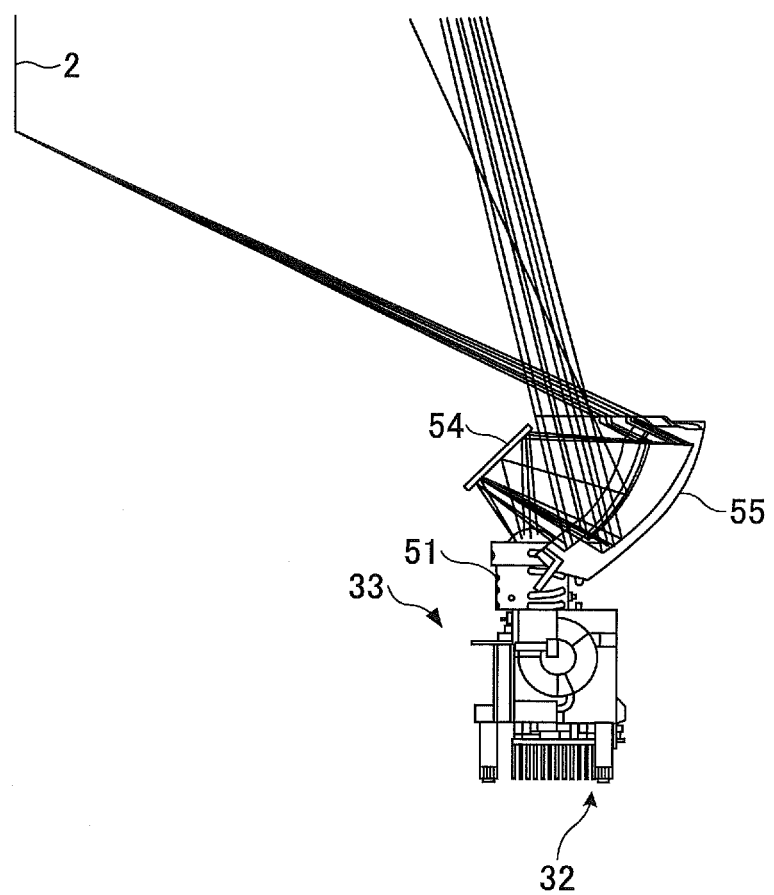
FIG. 9 explains a light path of the projection optical unit.

FIG. 9 is a side view illustrating a light path in the projection optical unit 33. The projection light of the video passes through the projection lens 51 so as to be extended, and then the light path of the extended light is turned by the return mirror 54. Then, the projection light is subjected to the extended projection onto the screen 2 by the free curved surface mirror 55. With the above structure, the tower type where the optical engine unit 30 can be arranged close to the screen 2 and the light path extends in the vertical direction can be adopted for the image projection apparatus 1. Therefore, the installation area of the image projection apparatus 1 can be made small.

[First Embodiment]
<Cooling Apparatus>

Described next is a cooling apparatus 50 of the first embodiment of the present invention.

Figure 10:
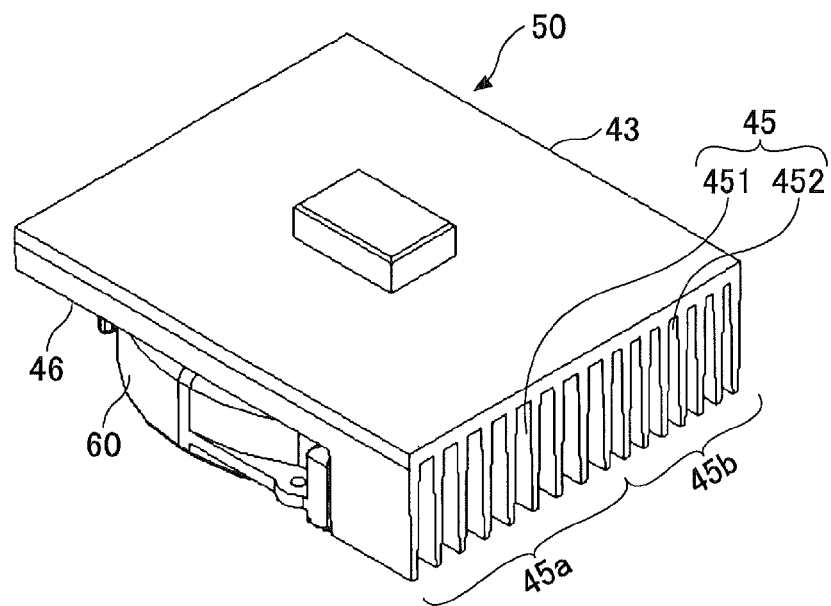
FIG. 10 is a perspective view of a structure of a cooling apparatus of the first embodiment.

FIG. 10 is a perspective view of the entire structure of the cooling apparatus 50. The cooling apparatus 50 is formed by combining the heatsink 43 illustrated in FIG. 6 and the sirocco fan 60 provided inside the cooling apparatus 50 and on a bottom surface of the heatsink 43.

In a case where the heatsink 43 is installed in the image projection apparatus 1, a cooling structure is provided for cooling two cooling targets, namely, the DMD element 41 of the image processing unit 32 and the light source device 20.

Multiple fins 45 (corresponding to heat dissipating fins) extending in the vertical direction are arranged in parallel in the above heatsink 43. The above heatsink 43 is structured to cool the cooling target by directly causing a cooling air to blow from the sirocco fan 60 to the fins 45.

The fins 45 illustrated in FIG. 10 are arranged in parallel and in a direction perpendicular to a short side of the heatsink 43 while interposing a predetermined pitch between the fins 45. Gaps between the fins 45 at the intervals form a flow path for the cooling air.

The fins 45 are arranged in a first heat dissipating area 45a and a second heat dissipating area 45b whose surface area is wider than that of the first heat dissipating area 45a. Hereinafter, the fins arranged in the first heat dissipating area 45a are referred to as a reference symbol 451, and the fins arranged in the second heat dissipating area 45b are referred to as a reference symbol 452.

Within the first embodiment, the surface areas of the fins in the first heat dissipating area 45a and the second heat dissipating area 45b are different by differentiating the pitch of the fins 452 in the second heat dissipating area 45b from the pitch of the fins 451 in the first heat dissipating area 45a. The pitches of the fins, the first heat dissipating area 45a, and the second heat dissipating area 45b are described later in detail.

Within the first embodiment, a step portion is formed at a part of the heatsink 43, and the sirocco fan 60 is accommodated in the step portion 46. Thus, the sirocco fan 60 and the heatsink 43 are integrally connected to form the cooling apparatus 50. Therefore, the outer shape of the cooling apparatus 50 is substantially a rectangular parallelepiped, by which a necessity of a design change to the other peripheral part is minimally limited.

The four sides on the upper surface of the heatsink 43 are linear to make the upper surface shape of the heatsink 43 rectangular. The corners may be rounded (chamfered). Within the first embodiment, the right edge side on the upper surface of the heatsink is aligned (flattened). The heatsink 43 of the cooling apparatus 50 is connected to another peripheral device (a peripheral part) such as a light source device at the right edge side of the heatsink 43. If a step or the like is formed on the right edge side, a design change in a connecting part for connecting the heatsink 43 with the peripheral device may be required. Within the first embodiment, a connecting edge side on the upper surface of the heatsink 43 is linearly aligned so as to avoid the design change of the peripheral part.

The sirocco fan 60 corresponds to an air blow part which takes in an outer air and causes the outer air to be blown to the heatsink 43. The sirocco fan 60 may have a structure where a cylinder having many small forward vanes and an air adjuster are combined. The sirocco fan 60 may have a static pressure efficiency of 60% which is ordinary.

Figure 11:
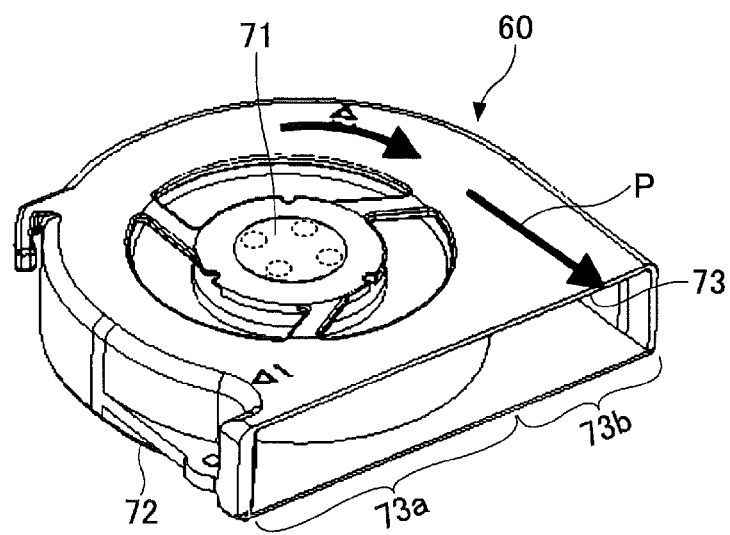
FIG. 11 is a perspective view illustrating a structure of a sirocco fan.

Referring to FIG. 11, the sirocco fan 60 includes a first air intake port 71, a second air intake port 72, and an air outtake port 73. The second air intake port 72 is provided on a side opposite to a side of the first air intake port 71. The sirocco fan 60 is a type of suctioning from both sides. Said differently, within the first embodiment, the first air intake port 71 is provided on the upper surface side of the sirocco fan 60 and the second air intake port 72 is provided on the bottom surface side of the sirocco fan 60. Further, the air outtake port 73 of the sirocco fan 60 is wide, said differently, the width is greater than the thickness (height). This feature is adopted to further enhance a cooling efficiency.

It is possible to make an area of taking out the cooling air greater by the sirocco fan 60 having a wider air outtake port 73 so as to increase a contact area between the cooling air and the heatsink. By increasing a contact surface area between the cooling air and the heatsink 43, a cooling efficiency can be improved. A method (described below) of increasing the surface area can be substantialized by devising a structure of the heat dissipating fins 451.

In the sirocco fan 60, the generated cooling air flows in a clockwise direction and is introduced into the air outtake port 73. Therefore, a fast flow concentrates on an end side indicated by an arrow P. Therefore, a wind speed of the outgoing cooling air is not even in a width direction (a longitudinal direction) of the air outtake port 73. There are a position where the wind speed is fast and a position where the wind speed is slow. Therefore, referring to FIG. 11, the wind speed is fast at a right position on the air outtake port 73. The wind speed is slow at other positions on the air outtake port 73. Therefore, the wide air outtake port 73 includes a first air outtake area 73a where the cooling air having a predetermined first flow rate of a low flow rate flows and a second air outtake area 73b where the cooling air having a second flow rate higher than the first flow rate flows.

The first air outtake area 73a corresponds to the first heat dissipating area 45a of the fins 45, and the second air outtake area 73b corresponds to the second heat dissipating area 45b of the fins 45.

Figure 12:
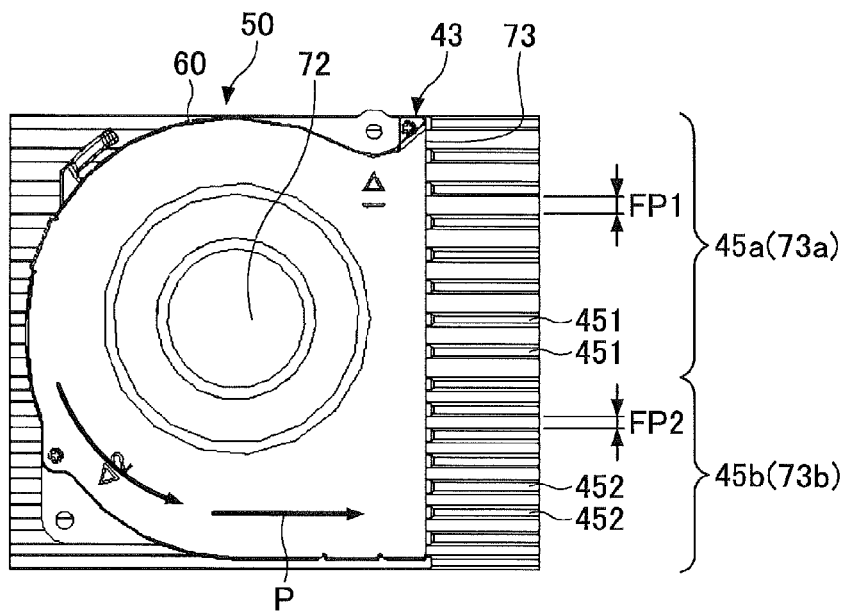
FIG. 12 is a bottom view of the cooling apparatus illustrated in FIG. 10.

FIG. 12 is a bottom view of the cooling apparatus 50 having the sirocco fan 60. Referring to FIG. 12, the fins 451 in the first heat dissipating area 45a are arranged in the first air outtake area 73a. The fins 452 in the second heat dissipating area 45b are arranged in the second air outtake area 73b.

As illustrated in FIG. 12, because the fins 451 and 452 are arranged at positions which are outside the air outtake port 73 and face the air outtake port 73, the fins 451 and 452 are prevented from clogging the inside of the air outtake port 73 so as to increase the static pressure of sirocco fan 60.

The surface area of the multiple fins 452 arranged in the second air outtake area 73b having a high flow rate is increased by narrowing a fin pitch FP2 of the fins 452. A fin pitch FP1 of the fins 451 arranged in the first air outtake area 73a where the cooling air having a low flow rate is widened (a coarse arrangement). The fin pitch is a gap between the fins. A relationship between the fin pitch FP1 and the fin pitch FP2 is preferably FP2=FP1×1/2.

As described, in the second air outtake area 73b where the cooling air has the high flow rate, the fin pitch FP2 of the fins 452 is narrowed to increase the surface area. Thus, the heatsink 43, to which the DMD element 41 (a first cooling target) requiring a strict temperature rating is fixed, can be efficiently cooled with priority.

On the other hand, in the first air outtake area 73a, through which the cooling air of the low flow rate passes, the fin pitch of the fins 451 is widened to reduce a wind resistance and make the cooling air easily flow. Therefore, the cooling air passing through the first heat dissipating area 45a can be used to cool the second cooling target arranged on a downstream side of the cooling air. Said differently, the heatsink 43 is cooled by the fins 452 of the narrow fin pitch in the second heat dissipating area 45b, and the cooling target on the downstream side is cooled by the fins 451 of the wide fin pitch in the first heat dissipating area 45a.

Figure 13:
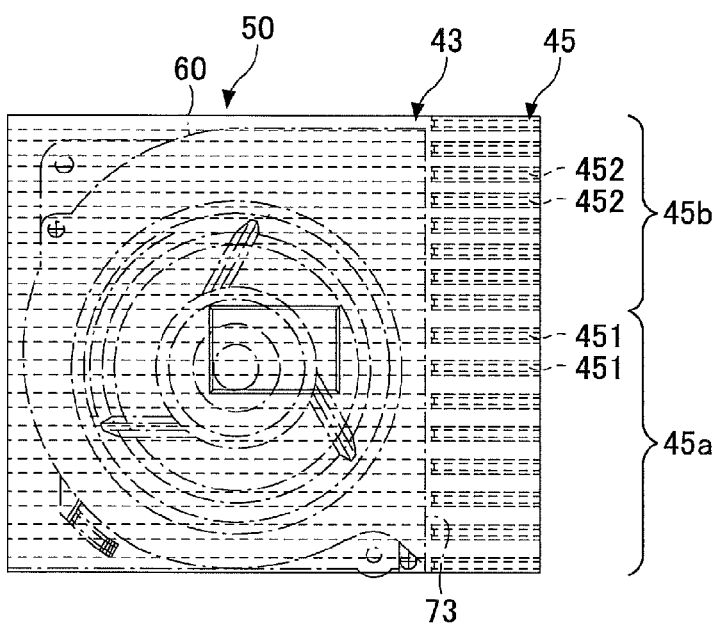
FIG. 13 is a plan view of the cooling apparatus illustrated in FIG. 10.

FIG. 13 is a plan view of the cooling apparatus 50.

As described, the heatsink 43 includes the first heat dissipating area 45a and the second heat dissipating area 45b having different surface areas of the fins 45. As illustrated in FIG. 13, the end sides on the upper surface of the heatsink 43 are linearly arranged, and the upper surface shape is maintained to be a rectangular shape. This means that there is no change in a basic size of the heatsink 43.

Further, the outer shape of the cooling apparatus 50 is like a rectangular parallelepiped as illustrated in FIG. 10. An advantage of the shape of the rectangular parallelepiped is that the cooling apparatus 50 may be assembled with other various apparatuses and various locations without a design change in the peripheral part surrounding the cooling apparatus 50. Then, a cost can be drastically reduced and a degree of freedom in a design (a layout) can be improved.

As described above, in the cooling apparatus 50 of the first embodiment, an adjustment between "an enhancement of a heat dissipation efficiency of the heatsink 43, which is equal to a further increase of the surface area of the fins 452 arranged in the second heat dissipating area 45b" and "a reduction of the wind resistance through the first heat dissipating area 45a to enhance the cooling efficiency for the other cooling target arranged on the downstream side of the first heat dissipating area 45a, which is equal to a further reduction of the surface area of the first heat dissipating area 45a" can be performed without causing a change in a basic size of the heatsink 43.

When the surface area of the fins is changed, it is important not to cause the change in the basic size of the heatsink 43. Said differently, when the size is changed, there is a probability that the size of a former metallic die does not match. In this case, there occurs a need for a new design of the metallic die which causes a drastic cost increase.

Within the first embodiment, the surface areas are differentiated by the change of the fin pitches without changing the basic size. Because the change of the fin pitches can be accomplished by changing a secondary processing or changing a bush of a metallic die while using the same metallic die, the metallic die can be cannibalized with a small cost variation.

By maintaining the size of the heatsink 43 without change and making the outer shape of the cooling apparatus 50 substantially the rectangular parallelepiped, the cooling apparatus 50 can be cannibalized to the various apparatuses and various arrangements without the design change in the peripheral part of the heatsink 43 or the design change in the cooling apparatus 50.

For example, in a case where the second cooling target is a light source device, there is a case where a cooling balance is degraded by a change in a quantity of the cooling air desired by the second cooling target when a minor change such as an improvement in a lamp output is done. At this time, the heatsink whose fins are adjusted to perform an optimum cooling balance can be assembled (replaced) without a layout change or the design change of the peripheral part. Resultantly, it becomes possible to adjust a cooling balance while minimizing a development cost.

<Cooling Structure>

Figure 14:
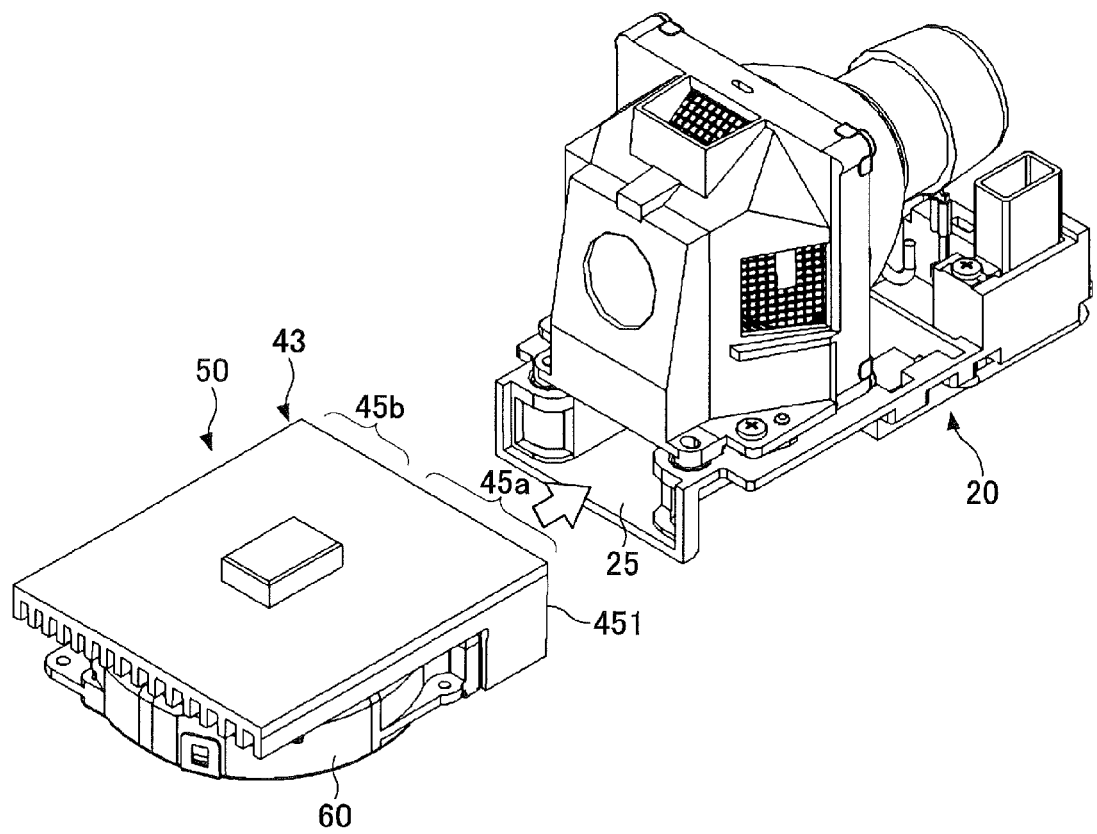
FIG. 14 is a perspective view of an example of an entire cooling structure including the cooling apparatus of the first embodiment.

Described next is the cooling structure of the first embodiment of the present invention. FIG. 14 is a perspective view of an entire cooling structure having the cooling apparatus 50 of the first embodiment. For example, the light source device 20 is arranged as the second cooling target on the downstream side of the air flow path of the cooling apparatus.

As illustrated in FIG. 14, this cooling structure is formed by linearly arranging the sirocco fan 60 which is a cooling source for forced air cooling, the heatsink 43, and the light source device 20 being the second cooling target. A straight line along the first heat dissipating area 45a where the fins 451 are arranged is connected to a duct 25 for cooling the light source device 20. With this structure, the cooling air passing through the first heat dissipating area 45a without degrading a wind volume enters inside the duct 25 so as to be used for cooling the light source device 20. On the other hand, the heatsink 43 is efficiently cooled in the second heat dissipating area 45b of the fins 452 having the narrow pitch.

Within the cooling structure of the first embodiment, two parts of the heatsink 43 (the DMD element 41) and the light source device 20 are efficiently cooled by the single sirocco fan 60.

A reason why the light source device 20 is cooled is to prevent burn injury at a time of replacing the lamp. When the lamp is replaced, a user touches the bottom surface of the light source device 20. Therefore, the light source device 20, especially, a lower portion thereof is required to be cooled.

Referring to the rated temperature, the rated temperature of the DMD element (an image displaying element) 41 of the image processing unit 32, to which the heatsink 43 is attached, is 70° C. However, because this 70° C. is determined in consideration of heat of the DMD element 41 itself, it is preferable to design so that a surface temperature is about 65° C. obtained by offsetting the heat of the DMD element 41 itself. On the other hand, there is no specific standard for the temperature of the lower part of the light source device 20 arranged on the downstream side. A portion possibly touched by the user is allowed to have 95° C. or lower. Because of this background, it is preferable to give priority to cooling of the DMD element 41 attached to the heatsink 41. Therefore, by arranging the second air outtake area 73b where the wind speed is high so as to face the second heat dissipating area 45b having fins 45, the DMD element 41 is preferentially cooled through the heatsink 43.

Further, by causing the first air outtake area 73a having a low wind speed to face the first heat dissipating area 45a having the small surface area and the small wind resistance, the wind speed is prevented from decreasing so as to provide a structure of cooling the light source device 20 with an allowance temperature.

Figure 15:
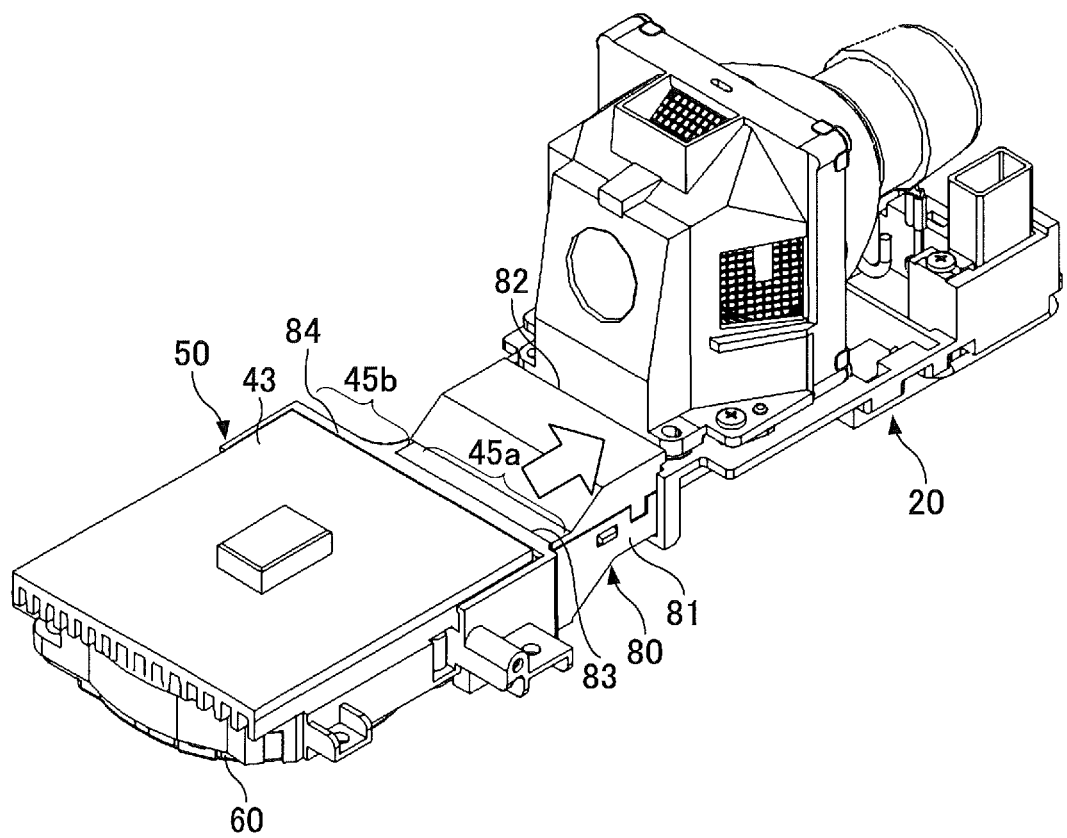
FIG. 15 is a perspective view of an example of an entire cooling structure having a duct of the first embodiment.
Figure 16:
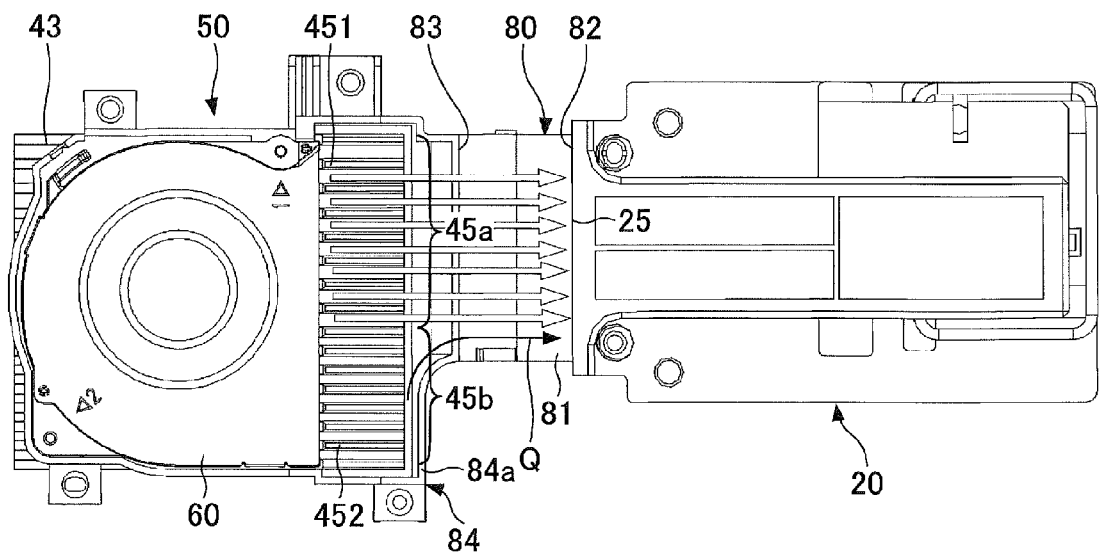
FIG. 16 is a bottom view of the cooling structure illustrated in FIG. 15.

As a method of introducing the cooling air passing through the first heat dissipating area 45a into the duct 25 for cooling the light source device 20 with a less loss, it is preferable to newly provide a connection duct illustrated in FIG. 15. FIG. 16 is a bottom view of a cooling structure where the connection duct 80 (hereinafter, simply referred to as a duct 80) is used for the connection.

The duct 80 is used to guide the cooling air outgoing from the sirocco fan 60 into the light source device 20 without a leakage. A further improvement in the cooling efficiency is provided by a function of guiding the wind performed by the duct 80.

Said differently, the duct 80 has a flow path 81 for flowing the cooling air, and a tip end portion 82 in the flowing direction of the cooling air is connected to the duct 25 of the light source 25. A base end portion 83 arranged at a base in the flowing direction of the cooling air has a connecting portion 84, which holds by sandwiching side surfaces where the fins 45 are arranged. The duct 80 is connected to the cooling apparatus 50 by the connecting portion 84.

The flow path 81 of the duct 80 is arranged along an extended line of the first heat dissipating area 45a. Therefore, when the cooling air having the low wind speed flows through the first heat dissipating area 45a without further decreasing the wind speed on a downstream side, the duct 80 can efficiently send the cooling air having the low wind speed to the light source device 20 without an air leakage.

A width of the flow path 81 perpendicular to the flowing direction of the cooling air is formed to be slightly wider than the first heat dissipating area 45a so that the cooling air can be securely flown from the first heat dissipating area 45a. As described above, in the cooling apparatus 50 of the first embodiment, the preferential cooling target is the DMD element 41 attached to the heatsink 43. Therefore, the cooling air from the sirocco fan 60 is mainly provided to the heatsink 43.

In consideration of the above points, a collision wall 84a is provided in the connecting portion 84 of the duct 80. The cooling air outgoing from the second heat dissipating area 45b collides with the collision wall 84a provided in the vicinity of an outgoing side of the second heat dissipating area 45b. It is possible to expect that the cooling air sufficiently reaches tip ends of the fins 452 arranged in the second heat dissipating area 45b.

Ordinarily, the cooling air passing through the fins 45 has a higher wind speed at a position closer to an entrance side of the fins 45 and a lower wind speed at a position closer to an exit side of the fins 45. Therefore, a cooling capability is lower at a position closer to an exit side (an outtake side) of the fins 45. By providing the collision wall 84a in the vicinity of the outtake side of the fins 252 arranged in the second heat dissipating area 45b, the cooling air outgoing from the sirocco fan 60 passes through the fins 452 in the second heat dissipating area 45b and then collides with the collision wall 84a. At this time, the flow of the cooling air is changed from a laminar flow to a turbulent flow so as to be agitated in the vicinity of the exit of the fins 452. Therefore, the wind air can sufficiently reach the tip ends of the fins on the outtake side of the fins 452.

However, if the entire face of the second heat dissipating area 45b in the vicinity of the outtake side is covered by the collision wall 84a, the static pressure may increase and a property of wind volume inherent in the sirocco fan 60 may not be performed. Therefore, an end portion of the collision wall 84a connected to the flow path 81 is formed in a rounded shape so that the cooling air passing through the second heat dissipating area 45b is guided to the flow path 81 (along an arrow Q). Thus, the static pressure of the sirocco fan 60 is prevented from increasing. Further, the cooling air passing through the second heat dissipating area 45b can be used for cooling the light source device 20 (the second cooling target).

As described above, the cooling structure of the first embodiment does not require the design change and the layout change of the peripheral parts surrounding the cooling apparatus 50 such as the bracket for holding the sirocco fan 60, the duct 80, and the parts and the position of the light source device 20 when a balance of cooling is changed by changing the pitches of the fins 451 and 452 of the cooling apparatus 50.

[Second Embodiment]
<Cooling Apparatus>

Figure 17:
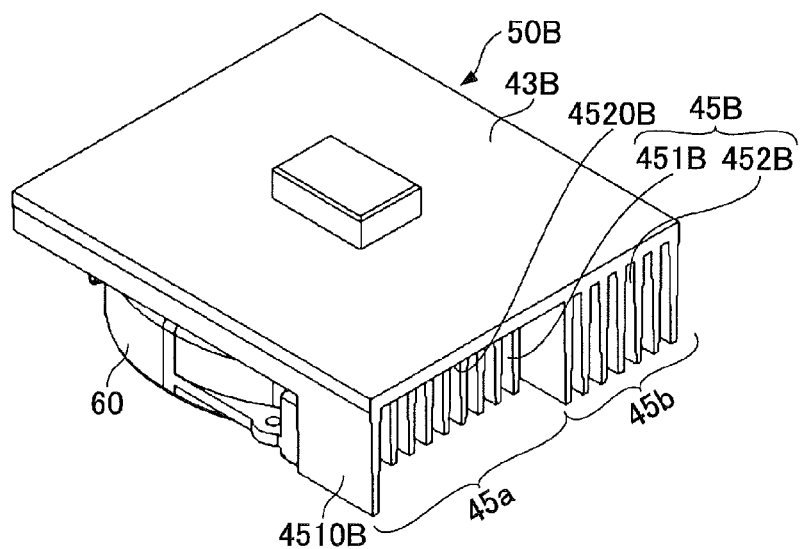
FIG. 17 is a perspective view of a structure of a cooling apparatus of a second embodiment.
Figure 18:
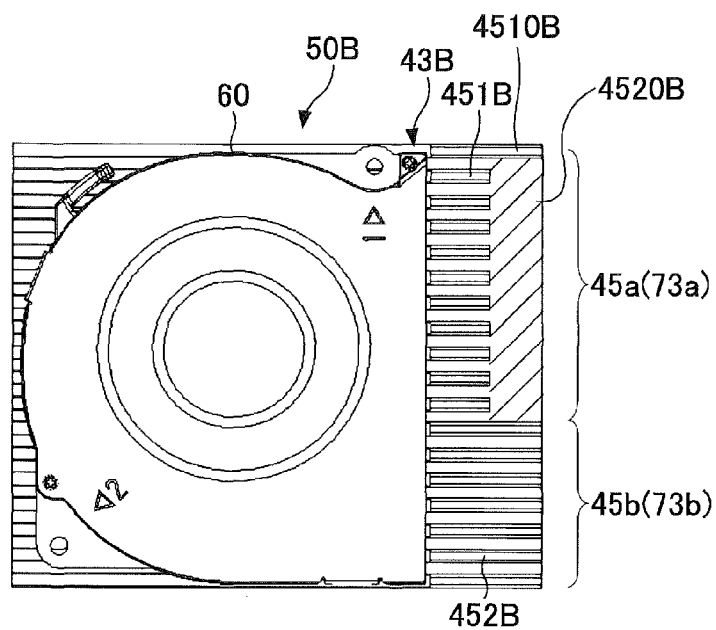
FIG. 18 is a bottom view of the cooling apparatus illustrated in FIG. 17.

Referring to FIGS. 17 and 18, described next is a cooling apparatus 50B of a second embodiment. FIG. 17 is a perspective view of an entire structure of the cooling apparatus 50B viewed from an upside. FIG. 18 is a bottom view of the cooling apparatus 50B. Because the structure of the second embodiment is basically similar to that of the first embodiment, only a difference is described below.

The difference from the first embodiment is a change of the surface areas of the fins in the first heat dissipating area 45a and the second heat dissipating area 45b by differentiating the lengths of fins 451B arranged in the first heat dissipating area 45a from the lengths of fins 452B arranged in the second heat dissipating area 45b.

By the change of the lengths of the fins 451B from the lengths of the fins 452B, the heatsink 43B of the first embodiment includes two areas, namely a first heat dissipating area 45a having a small surface area (a small wind resistance) and a second heat dissipating area 45b having a large surface area (a high heat dissipation efficiency to the heatsink 43).

Specifically, as illustrated in FIG. 18, the lengths of the fins 452B in the second heat dissipating area 45b of the heatsink 43B facing a second air outtake area 73b having a high flow rate are made longer than the fins 451B in the first heat dissipating area 45a of the heatsink 43B so as to expand the surface area of the fins.

As described above, the heatsink 43B can be effectively cooled by increasing the surface area of the fins 452B of the second air outtake area 73b, through which the cooling air having the high flow rate passes. Further, the lengths of the fins 451B in the first heat dissipating area 45a, which is arranged so as to face the first air outtake area 73a, through which the cooling air having the low flow rate passes, are made shorter than the above fins 452B. The fin pitches of the fins 451B and 452B are the same and only the lengths of the fins 451B and 452B are different. The amount of the change in the surface areas of the first heat dissipating area 45a and the second heat dissipating area 45b in the second embodiment are the same as that in the first embodiment.

As described above, in the first air outtake area 73a, through which the cooling air of the low flow rate passes, the surface area of the fins 451B is made small to reduce a wind resistance and make the cooling air easily flow. Therefore, the cooling air passing through the first heat dissipating area 45a can be used to cool the second cooling target arranged on a downstream side of the cooling air.

Within the second embodiment, although the lengths of the fins 452B and the fins 451B are different, the end side on the upper surface of the heatsink 43 is linearly aligned. The shape of the upper surface and the size (the outer shape) of the cooling apparatus 50 are not changed at all from the first embodiment.

In order to remain the shape unchanged, an upper wall 4520B (hatched lines in FIG. 18) is formed at a part where the lengths of the fins 451B are short. The upper wall 4520B performs a function of preventing the cooling air from leaking.

An end fin 4510B positioned in the outermost side (a side surface side) of the fins 451B arranged in the first heat dissipating area 45a has the same length as the fins 452B arranged in the second heat dissipating area 45b. The end fin 4510B is provided to be used as a wind guide path for guiding the wind to the light source device 20 without disordering the cooling air outgoing from the first heat dissipating area 45a. Further, in the cooling structure described below, it is possible to perform a function of preventing a leakage of the cooling air to the flow path 81 of the duct 80 connected to the light source device 20.

Although the cooling apparatus 50B of the second embodiment is different from that of the first embodiment with respect to the lengths and the fin pitches of the fins 452B and 451B, the upper surface shape of the heatsink 43B and the outer shape of the cooling apparatus 50B are the same as those of the first embodiment. Therefore, the heatsink can be adjusted to have a good cooling balance, and this heatsink can be replaced without providing a design change of the bracket holding the sirocco fan 60 and a peripheral part surrounding the heatsink. Further, it is possible to minimize a layout change and a design change of the peripheral part (the peripheral device) surrounding the cooling apparatus. Since the amounts of the changes of the surface areas between the first heat dissipating area 45a and the second heat dissipating area 45b are equal to those of the first embodiment, a good cooling effect can be prospected.

Further, although the length of the fins is changed as a parameter for changing the surface area, the change of the length of the fins can be accomplished by changing a secondary processing or changing a bush of a metallic die while using the same metallic die, the metallic die can be cannibalized with a small cost variation.

<Cooling Structure>

Figure 19:
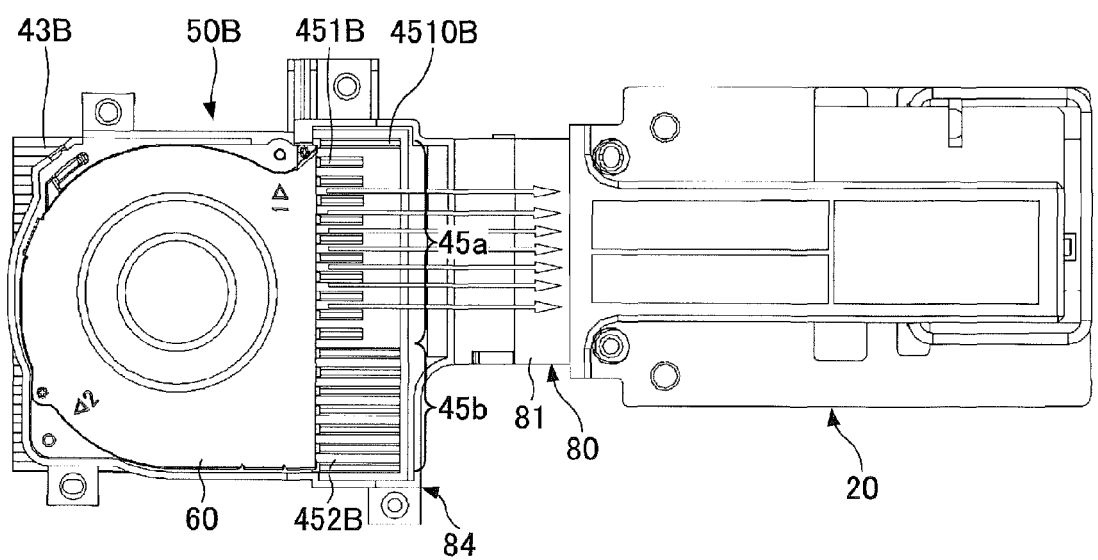
FIG. 19 is a bottom view of an example of a cooling structure including a cooling apparatus of the second embodiment.

Described next is an example of a cooling structure using the cooling apparatus 50B of the second embodiment. FIG. 19 is a bottom view of the cooling structure. The perspective view of the cooling structure viewed from an upside is completely the same as FIG. 15. Therefore, the illustration is omitted.

The cooling structure of the second embodiment is substantially the same as the cooling structure of the first embodiment. The cooling apparatus 50B, the duct 80, and the light source device 20 are linearly arranged. Therefore, an overlapping explanation is omitted.

The reason why the perspective view of the cooling structure viewed from the upside is completely the same as FIG. 15 is that the upper surface shape of the heatsink 43B and the outer shape of the cooling apparatus 50B are maintained even though the lengths of the fins 451B and 452B of the heatsink 43B are differentiated.

In the cooling structure using the cooling apparatus 50B of the second embodiment, the length of the fins 451B of the cooling apparatus 50B differs from that of the second embodiment. However, the amounts of the changes of the surface areas are the same. Therefore, there is no difference in the flow of the wind air in comparison with the first embodiment, and the cooling air outgoing from the first heat dissipating area 45a is efficiently sent to the light source device 20 and cooled. Further, even though a cooling balance is changed by changing the shape of the fins 451B, it is unnecessary to provide the design change or the layout change of the peripheral part surrounding the cooling apparatus such as the bracket for holding the sirocco fan 60, the duct 80, and the parts or the position of the light source device 20.

[Third Embodiment]
<Cooling Apparatus>

Figure 20:
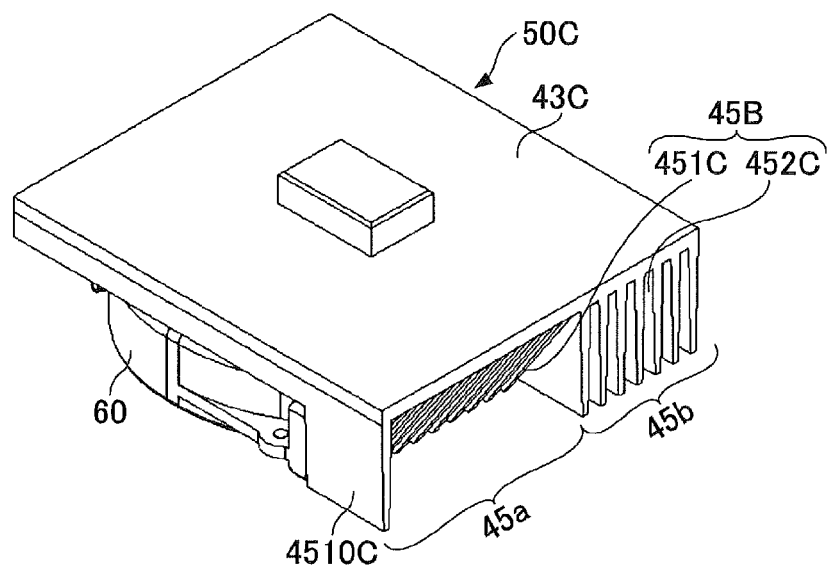
FIG. 20 is a perspective view of a structure of a cooling apparatus of a third embodiment.
Figure 21:
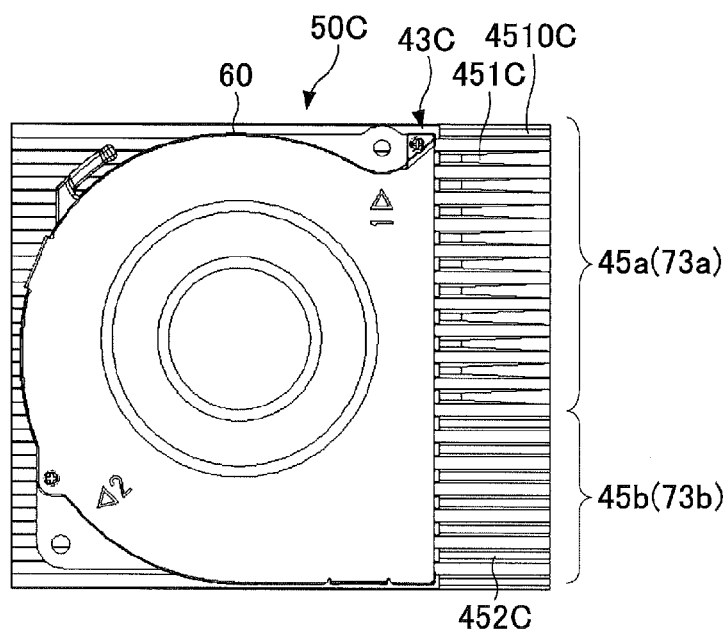
FIG. 21 is a bottom view of the cooling structure illustrated in FIG. 20.
Figure 22:
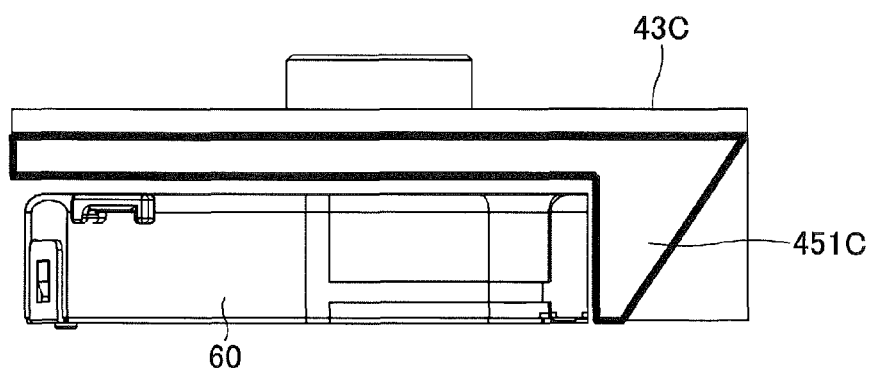
FIG. 22 is a side view which schematically illustrates a shape of the fin arranged in a first heat dissipating area.

Referring to FIGS. 20 to 22, described next is a cooling apparatus 50C of a third embodiment. FIG. 20 is a perspective view of an entire structure of the cooling apparatus 50C viewed from an upside. FIG. 21 is a bottom view of the cooling apparatus 50C. FIG. 22 is a side view schematically illustrating the shape of the fins 451C.

Because the structure of the third embodiment is basically similar to that of the first embodiment, only a difference is described below.

The difference from the first embodiment is that the shape of the fins 451C, which are fins 45C in the first heat dissipating area 45a, in their longitudinal cross-sectional view is changed from that of the fins 452C, which are fins 45C in the second heat dissipating area 45b, to change the surface areas. The fins 452C are formed to be in the same shape (the longitudinal cross-sectional shape) as those of the first and second embodiments so as to increase the surface area. As described above, the heatsink 43C can be effectively cooled by increasing the surface area of the fins 452C of the second air outtake area 73b, through which the cooling air having the high flow rate passes.

The amounts of the changes of the surface areas between the first heat dissipating area 45a and the second heat dissipating area 45b are equal to those of the first embodiment. By the change of the shape (the longitudinal cross-sectional shape) of the fins 451C from the those of the fins 452C, the heatsink 43C of the third embodiment includes two areas, namely the first heat dissipating area 45a having a small surface area (a small wind resistance) and the second heat dissipating area 45b having a large surface area (a high heat dissipation efficiency to the heatsink 43C).

Specifically, the longitudinal cross-section of the fins 451C is shaped downward and inward depressed from the end side of the upper surface of the heat dissipater 43 as illustrated in the schematic side view of FIG. 22. Referring to FIG. 22, sides of the fins 451C facing the sirocco fan 60 vertically stands (protrudes), and the other sides downward and inward slant at about 45°. Since the sides of the fins 451C facing the sirocco fan 60 vertically stands (protrudes) without slanting, the sirocco fan 60 can be preferably arranged and it is possible to prevent a useless gap from occurring so as to prevent a loss of a heat dissipation effect. Further, because the other side surface downward and inward slants, the upper surface shape of the heatsink 43C does not change while keeping the surface area to be small (the wind resistance is kept to be small). Said differently, it is possible to maintain the shape where the end side of the upper surface of the heatsink 43C is linearly aligned.

As described above, in the first air outtake area 73a, through which the cooling air of the low flow rate passes, the surface area of the fins 451C is made small to reduce a wind resistance and make the cooling air easily flow. Therefore, the cooling air passing through the first heat dissipating area 45a can be used to cool the second cooling target arranged on a downstream side of the cooling air.

An end fin 4510C positioned in the outermost side (a side surface side) of the fins 451C arranged in the first heat dissipating area 45a has the same length as the fins 452C arranged in the second heat dissipating area 45b. The end fin 4510C is provided to be used as a wind guide path for guiding the wind to the light source device 20 without disordering the cooling air outgoing from the first heat dissipating area 45a. Further, in the cooling structure described below, it is possible to perform a function of preventing a leakage (a loss) of the cooling air to the flow path 81 of the duct 80 connected to the light source device 20.

Although the cooling apparatus 50C of the third embodiment has a shape different from the those of the first and second embodiments, the upper surface shape of the heatsink 43C and the outer shape of the cooling apparatus 50C are the same as those of the first embodiment. Therefore, the heatsink can be adjusted to have a good cooling balance, and this heatsink can be replaced without providing a design change of the bracket holding the sirocco fan 60 and a peripheral part surrounding the heatsink. Further, it is possible to minimize a layout change and a design change of the peripheral part (the peripheral device) surrounding the cooling apparatus.

Since the amounts of the changes of the surface areas between the first heat dissipating area 45a and the second heat dissipating area 45b are equal to those of the first embodiment, a good cooling effect can be prospected.

Further, although the shape of the fins is changed as a parameter for changing the surface area, the change of the shape of the fins can be accomplished by changing a secondary processing or changing a bush of a metallic die while using the same metallic die, the metallic die can be cannibalized with a small cost variation.

<Cooling Structure>

Figure 23:
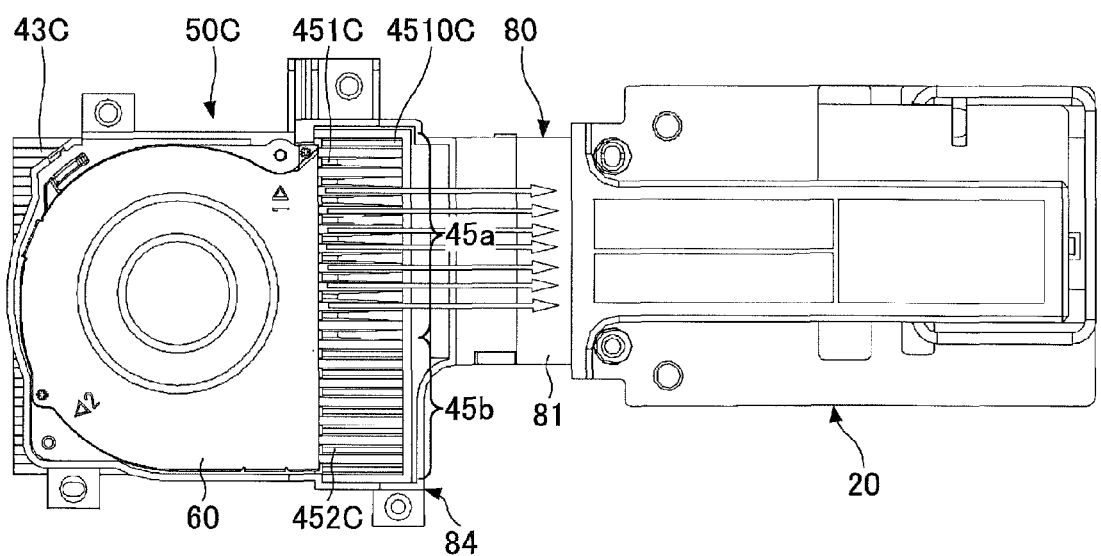
FIG. 23 is a bottom view of an example of a cooling structure including a cooling apparatus of a third embodiment.

Described next is an example of a cooling structure using the cooling apparatus 50C of the third embodiment. FIG. 23 is a bottom view of the cooling structure. The perspective view of the cooling structure viewed from an upside is completely the same as FIG. 15. Therefore, the illustration is omitted.

The cooling structure of the third embodiment is substantially the same as the cooling structure of the first embodiment. The cooling apparatus 50C, the duct 80, and the light source device 20 are linearly arranged. Therefore, an overlapping explanation is omitted.

The reason why the perspective view of the cooling structure viewed from the upside is the same as FIG. 15 is that the upper surface shape of the heatsink 43B and the outer shape of the cooling apparatus 50C are maintained even though the shapes of the fins 451C and 452C of the heatsink 43C are differentiated.

In the cooling structure using the cooling apparatus 50C of the third embodiment, the shape of the fins 451C of the cooling apparatus 50C differs from that of the first and second embodiments. However, the amounts of the changes of the surface areas are the same. Therefore, there is no difference in the flow of the wind air in comparison with the first and second embodiments, and the cooling air outgoing from the first heat dissipating area 45a is efficiently sent to the light source device 20 and cooled. Further, even though a cooling balance is changed by changing the shape of the fins 451C, it is unnecessary to provide the design change or the layout change of the peripheral part surrounding the cooling apparatus 50C such as the bracket for holding the sirocco fan 60, the duct 80, and the parts or the position of the light source device 20.

[Fourth Embodiment]

<Cooling Apparatus>

Figure 24:
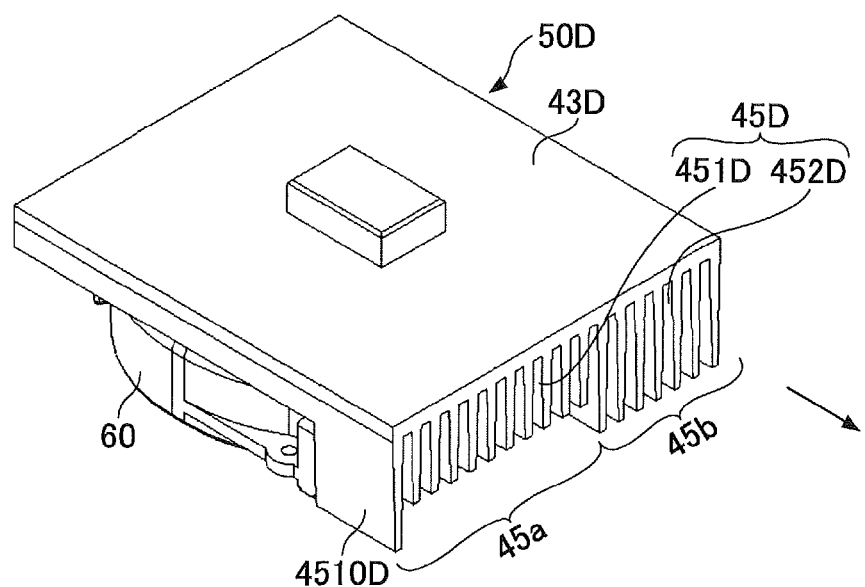
FIG. 24 is a perspective view of a structure of a cooling apparatus of a fourth embodiment.
Figure 25:
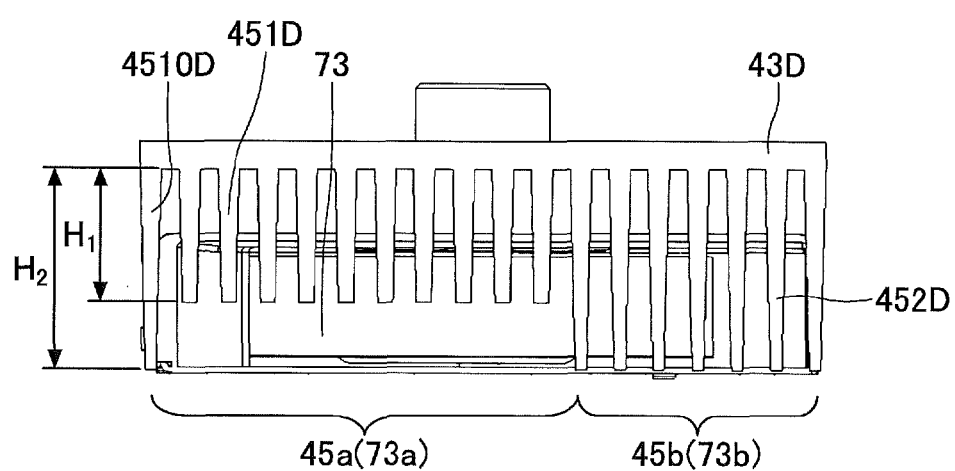
FIG. 25 is a front view of the cooling apparatus illustrated in FIG. 24 viewed in front of a direction of flowing a cooling air.
Figure 26:
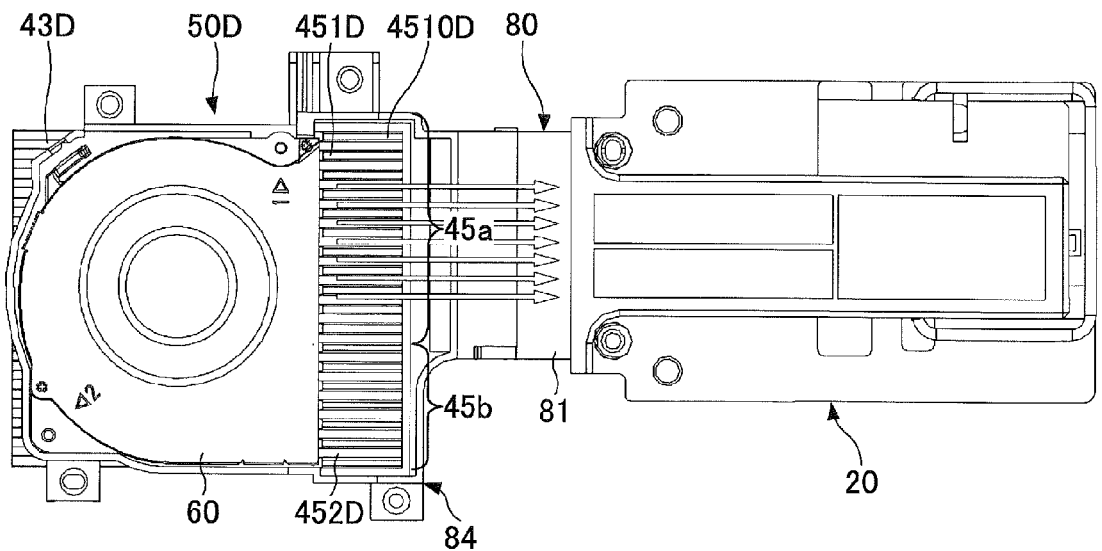
FIG. 26 is a bottom view of an example of a cooling structure including the cooling apparatus of the fourth embodiment.

Referring to FIGS. 24 and 25, described next is a cooling apparatus 50D of a fourth embodiment. FIG. 24 is a perspective view of an entire structure of the cooling apparatus 50D viewed from an upside. FIG. 25 is a front view of the cooling apparatus 50D viewed from a front side in a direction against the flowing direction of the cooling air.

Because the structure of the fourth embodiment is basically similar to that of the first embodiment, only a difference is described below.

The difference from the first embodiment is that the height of fins 451D, which are fins 45D in the first heat dissipating area 45a, is made lower than that of fins 452D, which are the fins 45D in the second heat dissipating area 45b, so as to change the surface areas. The fins 452D are formed to be in the same height (the longitudinal cross-sectional view) as those of the first to third embodiments so as to increase the surface area. As described above, the heatsink 43D can be effectively cooled by increasing the surface area of the fins 452D of the second air outtake area 73b, through which the cooling air having the high flow rate passes. The amounts of the changes of the surface areas between the first heat dissipating area 45a and the second heat dissipating area 45b are equal to those of the first embodiment.

By the change of the height of the fins 451D from the those of the fins 452D, the heatsink 43D of the fourth embodiment includes two areas, namely the first heat dissipating area 45a having a small surface area (a small wind resistance) and the second heat dissipating area 45b having a large surface area (a high heat dissipation efficiency to the heatsink 43D).

Specifically, as illustrated in FIG. 25, the height H1 of the fins 451D in the first heat dissipating area 45a arranged so as to face the first air outtake area 73a is made lower than the height H2 of the fins 452D in the second heat dissipating area 45b arranged so as to face the second air outtake area 73b (H1<H2) so as to decrease the surface area.

The height H2 of the fins 452D is similar to those in the first to third embodiment so as to increase the surface area of the fins 452D in comparison with that of the fins 451D. The height H1 of the fins 451D is from the upper portion of the heatsink 43D to a substantially center position of the first air outtake area 73a of the air outtake port 73 of the sirocco fan 60. Said differently, the fins 451D do not exist on a side facing a lower half of the first air outtake area 73a.

Therefore, because the cooling air outgoing from a lower side of the first air outtake area 73a passes through the fins 451D without a wind resistance, a cooling efficiency for the second cooling target arranged on the downstream side can be improved.

Within the fourth embodiment, although the height of the fins 451D is lower than that of the fins 452D, the upper surface shape and the size of the heatsink 43D are not changed from the first to third embodiments. Said differently, it is possible to maintain the shape where the end side of the upper surface of the heatsink 43D is linearly aligned.

An end fin 4510D positioned in the outermost side (a side surface side) of the fins 451D arranged in the first heat dissipating area 45a has the same length as the fins 452D arranged in the second heat dissipating area 45b. The end fin 4510D is provided to be used as a wind guide path for guiding the wind to the light source device 20 without disordering the cooling air outgoing from the first heat dissipating area 45a. Further, in the cooling structure described below, it is possible to perform a function of preventing a leakage of the cooling air to the flow path 81 of the duct 80 connected to the light source device 20.

Although the cooling apparatus 50D of the fourth embodiment has the height different from the that of the first embodiment, the upper surface shape of the heatsink 43D and the outer shape of the cooling apparatus 50D are the same as those of the first embodiment. Therefore, the heatsink can be adjusted to have a good cooling balance, and this heatsink can be replaced without providing a design change of the bracket holding the sirocco fan 60 and a peripheral part surrounding the heatsink. Further, it is possible to minimize a layout change and a design change of the peripheral part (the peripheral device) surrounding the cooling apparatus.

Since the amounts of the changes of the surface areas between the first heat dissipating area 45a and the second heat dissipating area 45b are equal to those of the first embodiment, a good cooling effect can be prospected.

Further, although the height of the fins is changed as a parameter for changing the surface area, the change of the height of the fins can be accomplished by changing a secondary processing or changing a bush of a metallic die while using the same metallic die, so the metallic die can be cannibalized with a small cost variation.

<Cooling Structure>

Described next is an example of a cooling structure using the cooling apparatus 50D of the fourth embodiment. FIG. 25 is a bottom view of the cooling structure. The perspective view of the cooling structure viewed from an upside is completely the same as FIG. 15. Therefore, the illustration is omitted. The bottom view of the cooling structure using the cooling apparatus 50D of the fourth embodiment is substantially the same as FIG. 16.

A reason why the bottom view and the perspective view are the same as FIGS. 15-16 is that the upper surface shape of the heatsink 43D and the outer shape of the cooling apparatus 50D are maintained even if the height of the fins 451D is made lower than the height of the fins 452D.

In the cooling structure using the cooling apparatus 50D of the fourth embodiment, the shape of the fins 451D of the cooling apparatus 50D differs from that of the first to third embodiments. However, the amounts of the changes of the surface areas are the same. Therefore, there is no difference in the flow of the wind air in comparison with the first to third embodiments, and the cooling air outgoing from the first heat dissipating area 45a is efficiently sent to the light source device 20 and cooled. Further, even though a cooling balance is changed by changing the shape of the fins 451D, it is unnecessary to provide the design change or the layout change of the peripheral part surrounding the cooling apparatus 50D such as the bracket for holding the sirocco fan 60, the duct 80, and the parts or the position of the light source device 20.

[Fifth Embodiment]

Within a fifth embodiment, described is an image projection apparatus 1, in which any one of the cooling apparatuses 50 to 50D of the first to fourth embodiments is installed.

The specific structure of the image projection apparatus 1 is such that at least the cooling apparatus 50, the light source device 20, and the optical engine 30 are included as illustrated in FIGS. 1 to 9 and so on. Because the structures are as described above, a description thereof is omitted.

Since any one of the cooling apparatuses 50 to 50D is installed in the image projection apparatus 1, a description thereof is omitted. Further, the cooling structures using the cooling apparatuses 50 to 50D are as described in the first to fourth embodiments. Therefore, a description thereof is omitted.

Therefore, the cooling apparatus (the cooling structure) matching the type, the size, and the performance of the image projection apparatus 1 can be installed in the image projection apparatus 1 so as to perform a preferable image projecting function.

Further, the heatsink, the cooling apparatus, and the cooling structure described above can be used for a cooling target installed in an electronic device such as a personal computer (PC) or an electronic circuit, in addition to the image projection apparatus.

<Modified Example>

According to the first to fourth embodiments, the heatsinks 43 to 43D have the step portion 46 so as to integrate with the sirocco fan 60. However, a cooling apparatus 50' having the following structure may be adopted.

Figure 27:
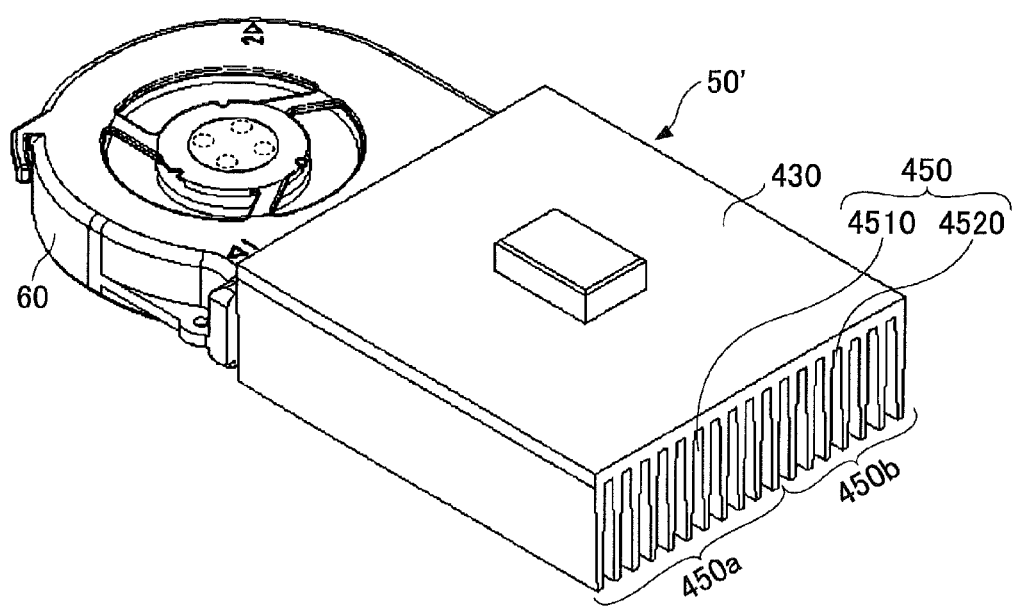
FIG. 27 is a perspective view of a modified example of a cooling apparatus of the first embodiment.

Said differently, a heatsink 430 may form the cooling apparatus 50'. The heatsink 430 may be shaped like a complete rectangular parallelepiped without having the step portion as illustrated in FIG. 27. The lengths, the heights, the shapes, and so on of fins 450 in first and second heat dissipating areas 450a and 450b may have variations as described in the first to fourth embodiments. FIG. 27 illustrates the variation of the fins 45 of the first embodiment.

In this modified example, the end side of the upper surface of the heatsink 430 is shaped so as to be linearly aligned, and the upper surface shape is a rectangle. The corners may be rounded (chamfered).

The sirocco fan 60 may be similar to that illustrated in the first to fourth embodiments, and is connected to the heatsink 430 through a connecting member (not illustrated) so as to form a cooling apparatus 500.

Since the heatsink 430 is shaped like the complete rectangular parallelepiped as described above, the heatsink 430 can be used by assembling into various apparatuses, various devices and various locations without performing a design change of a peripheral part or member surrounding the heatsink. Therefore, the heatsink 43 has high general-purpose properties.

According to the embodiments of the present invention, it is possible to provide the cooling apparatus which does not require the design change of the peripheral part at a time of replacing the heat dissipator.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although a cooling apparatus has been described in detail, it should be understood that various changes, substitutions, and alterations could be made thereto without departing from the spirit and scope of the invention.

This application is based upon and claims the benefit of priority of the prior Japanese Patent Application No. 2014-128006, filed on Jun. 23, 2014, the entire contents of which are incorporated herein by reference.

What is claimed is:

1. A cooling apparatus comprising:
    an air blow part including an air outtake port, out of which a cooling air flows, and
    a heat dissipater including a plurality of heat dissipating fins,
    wherein an end side of an upper wall of the heat dissipater is linearly aligned,
    wherein
        the plurality of heat dissipating fins forms a first heat dissipating area and a second heat dissipating area on the heat dissipater, the first heat dissipating area and the second heat dissipating area being mutually different and formed in the upper wall in common,
        wherein the first heat dissipating area has a small surface area, and the second heat dissipating area has a large surface area, the small surface area being smaller than the large surface area,
    wherein the air outtake port, out of which the cooling air flows, includes a first air outtake area having a small air flow-out rate and a second air outtake area having a great air flow-out rate, the small air flow-out rate being smaller than the great air flow-out rate, and
    wherein the first air outtake area having the small air flow-out rate is arranged to face the first heat dissipating area having the small surface area, and the second air outtake area having the great air flow-out rate is arranged to face the second heat dissipating area having the large surface area.

2. The cooling apparatus according to claim 1,
    wherein the first air outtake area is provided for taking out the cooling air and the second air outtake area is provided for taking out the cooling air.

3. The cooling apparatus according to claim 1,
    wherein a pitch of the heat dissipating fins arranged in the first heat dissipating area is greater than a pitch of the heat dissipating fins arranged in the second heat dissipating area.

4. The cooling apparatus according to claim 1,
    wherein a length of the heat dissipating fins arranged in the first heat dissipating area is shorter than a length of the heat dissipating fins arranged in the second heat dissipating area.

5. The cooling apparatus according to claim 1,
    wherein a longitudinal cross-sectional view of the heat dissipating fins arranged in the first heat dissipating area is shaped downward and inward depressed from the end side of the upper wall of the heat dissipater.

6. The cooling apparatus according to claim 1,
    wherein a height of the heat dissipating fins arranged in the first heat dissipating area is lower than a height of the heat dissipating fins arranged in the second heat dissipating area.

7. An image projection apparatus comprising:
    an image displaying element which displays an image;
    a projection optical unit which projects the image displayed on the image displaying element; and
    the cooling apparatus according to claim 1.

8. An electronic device comprising:
    a cooling target which is cooled; and
    the cooling apparatus according to claim 1,
    wherein the cooling apparatus cools the cooling target.

9. The cooling apparatus according to claim 1,
    wherein a relationship between the pitch of the heat dissipating fins in arranged in the first heat dissipating area and the pitch of the heat dissipating fins in arranged in the second heat dissipating area is represented by the equation $$FP2 = 0.5(FP1)$$

where FP1 is the pitch of the fins arranged in the first heat dissipating area, and FP2 is the pitch of the fins arranged in the second heat dissipating area.

* * * * *